(12) United States Patent
Kuramochi et al.

(10) Patent No.: US 11,362,028 B2
(45) Date of Patent: Jun. 14, 2022

(54) THROUGH-HOLE ELECTRODE SUBSTRATE

(71) Applicant: Dai Nippon Printing Co., Ltd., Tokyo (JP)

(72) Inventors: Satoru Kuramochi, Tokyo (JP); Sumio Koiwa, Tokyo (JP); Hidenori Yoshioka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/936,519

(22) Filed: Jul. 23, 2020

(65) Prior Publication Data

US 2020/0357733 A1 Nov. 12, 2020

Related U.S. Application Data

(63) Continuation of application No. 16/743,145, filed on Jan. 15, 2020, now Pat. No. 10,790,221, which is a (Continued)

(30) Foreign Application Priority Data

Nov. 21, 2013 (JP) ................................. 2013-241392

(51) Int. Cl.
*H01L 23/498* (2006.01)
*H01L 25/065* (2006.01)
(Continued)

(52) U.S. Cl.
CPC ...... *H01L 23/49827* (2013.01); *H01L 23/481* (2013.01); *H01L 23/49894* (2013.01);
(Continued)

(58) Field of Classification Search
CPC ......... H01L 23/49827; H01L 23/49894; H01L 23/481; H01L 25/18; H01L 25/065
See application file for complete search history.

(56) References Cited

U.S. PATENT DOCUMENTS 7,646,079 B2 1/2010 Umemoto
8,338,957 B2 12/2012 Nilsson
(Continued)

FOREIGN PATENT DOCUMENTS

CN 1601727 A 3/2005
CN 101785103 A 7/2010
(Continued)

OTHER PUBLICATIONS

Japanese Office Action dated Oct. 13, 2020 for the corresponding Japanese Application No. 2019-236195, with English machine translation.
(Continued)

*Primary Examiner* — Dale E Page
*Assistant Examiner* — Wilner Jean Baptiste
(74) *Attorney, Agent, or Firm* — Michael Best & Friedrich LLP

(57) ABSTRACT

A through-hole electrode substrate includes a substrate including a through-hole extending from a first aperture of a first surface to a second aperture of a second surface, an area of the second aperture being larger than that of the first aperture, the through-hole having a minimum aperture part between the first aperture and the second aperture, wherein an area of the minimum aperture part in a planer view is smallest among a plurality of areas of the through-hole in a planer view, a filler arranged within the through-hole, and at least one gas discharge member contacting the filler exposed to one of the first surface and the second surface.

2 Claims, 13 Drawing Sheets

Related U.S. Application Data continuation of application No. 16/266,203, filed on Feb. 4, 2019, now Pat. No. 10,580,727, which is a continuation of application No. 15/159,323, filed on May 19, 2016, now Pat. No. 10,256,176, which is a continuation of application No. PCT/JP2014/080649, filed on Nov. 19, 2014.

(51) Int. Cl.
| | | |
|---|---|---|
| *H01L 25/18* | (2006.01) | |
| *H05K 1/11* | (2006.01) | |
| *H05K 3/28* | (2006.01) | |
| *H05K 3/44* | (2006.01) | |
| *H01L 23/48* | (2006.01) | |
| *H01L 23/13* | (2006.01) | |
| *H01L 23/15* | (2006.01) | |
| *H01L 23/00* | (2006.01) | |

(52) U.S. Cl.
CPC ............ *H01L 25/065* (2013.01); *H01L 25/18* (2013.01); *H05K 1/115* (2013.01); *H05K 3/28* (2013.01); *H05K 3/445* (2013.01); *H01L 23/13* (2013.01); *H01L 23/15* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/13109* (2013.01); *H01L 2224/13144* (2013.01); *H01L 2224/13147* (2013.01); *H01L 2224/16145* (2013.01); *H01L 2224/16146* (2013.01); *H01L 2224/16165* (2013.01); *H01L 2224/16227* (2013.01); *H01L 2224/2919* (2013.01); *H01L 2224/32225* (2013.01); *H01L 2224/48091* (2013.01); *H01L 2224/48227* (2013.01); *H01L 2224/73257* (2013.01); *H01L 2224/81805* (2013.01); *H01L 2224/8385* (2013.01); *H01L 2225/0651* (2013.01); *H01L 2225/06517* (2013.01); *H01L 2225/06572* (2013.01); *H01L 2924/14* (2013.01); *H01L 2924/1432* (2013.01); *H01L 2924/1434* (2013.01); *H01L 2924/1461* (2013.01); *H01L 2924/1579* (2013.01); *H01L 2924/15787* (2013.01); *H01L 2924/15788* (2013.01); *H01L 2924/381* (2013.01); *H05K 2201/0959* (2013.01); *H05K 2201/09154* (2013.01); *H05K 2201/09563* (2013.01); *H05K 2201/09581* (2013.01); *H05K 2201/09854* (2013.01); *H05K 2203/0594* (2013.01)

(56) References Cited

U.S. PATENT DOCUMENTS

| | | | |
|---|---|---|---|
| 10,256,176 | B2 | 4/2019 | Kuramochi et al. |
| 10,790,221 | B2* | 9/2020 | Kuramochi ....... H01L 23/49827 |
| 2003/0116857 | A1 | 6/2003 | Taniguchi et al. |
| 2003/0137056 | A1 | 7/2003 | Taniguchi et al. |
| 2004/0217455 | A1 | 11/2004 | Shiono et al. |
| 2005/0104219 | A1 | 5/2005 | Matsui |
| 2006/0202348 | A1 | 9/2006 | Kameyama et al. |
| 2007/0155174 | A1 | 7/2007 | Taniguchi et al. |
| 2008/0083558 | A1 | 4/2008 | Chujo et al. |
| 2010/0133697 | A1 | 6/2010 | Nilsson |
| 2010/0164120 | A1 | 7/2010 | Nakayama et al. |
| 2010/0307809 | A1 | 12/2010 | Noda et al. |
| 2011/0048775 | A1 | 3/2011 | Ishida et al. |
| 2011/0062594 | A1 | 3/2011 | Maekawa et al. |
| 2011/0084400 | A1 | 4/2011 | Fujii |
| 2011/0147059 | A1 | 6/2011 | Ma et al. |
| 2011/0256344 | A1 | 10/2011 | Ono et al. |
| 2012/0001330 | A1 | 1/2012 | Huisinga et al. |
| 2012/0139082 | A1 | 6/2012 | Oganesian et al. |
| 2012/0186868 | A1 | 7/2012 | Noda et al. |
| 2012/0229990 | A1 | 9/2012 | Adachi et al. |
| 2012/0235969 | A1 | 9/2012 | Burns et al. |
| 2013/0048355 | A1 | 2/2013 | Furuta et al. |
| 2013/0107482 | A1 | 5/2013 | Inagaki et al. |
| 2013/0200516 | A1 | 8/2013 | Nakatani et al. |
| 2013/0316551 | A1 | 11/2013 | Day, Jr. et al. |
| 2014/0124242 | A1 | 5/2014 | Ito et al. |

FOREIGN PATENT DOCUMENTS

| | | |
|---|---|---|
| CN | 101925266 A | 12/2010 |
| CN | 102315183 A | 1/2012 |
| CN | 102970821 A | 3/2013 |
| CN | 103219302 A | 7/2013 |
| CN | 103258806 A | 8/2013 |
| EP | 2048923 A2 | 4/2009 |
| JP | H04-154187 A | 5/1992 |
| JP | 2976955 B2 | 11/1999 |
| JP | 2002-305360 A | 10/2002 |
| JP | 2003-133735 A | 5/2003 |
| JP | 2003-197811 A | 7/2003 |
| JP | 2003-198069 A | 7/2003 |
| JP | 2003-218525 A | 7/2003 |
| JP | 2003-243396 A | 8/2003 |
| JP | 2004-363212 A | 12/2004 |
| JP | 2006-237058 A | 9/2006 |
| JP | 4012375 B2 | 11/2007 |
| JP | 4022180 B2 | 12/2007 |
| JP | 4203277 B2 | 12/2008 |
| JP | 2009-023341 A | 2/2009 |
| JP | 4241202 B2 | 3/2009 |
| JP | 4319831 B2 | 8/2009 |
| JP | 2010-118645 A | 5/2010 |
| JP | 2010-171377 A | 8/2010 |
| JP | 2010-532562 A | 10/2010 |
| JP | 4564342 B2 | 10/2010 |
| JP | 2010-287878 A | 12/2010 |
| JP | 2011-082531 A | 4/2011 |
| JP | 4702794 B2 | 6/2011 |
| JP | 2011-210794 A | 10/2011 |
| JP | 4835141 B2 | 12/2011 |
| JP | 5119623 B2 | 1/2013 |
| JP | 2013-512583 A | 4/2013 |
| WO | 2003/007370 A1 | 1/2003 |
| WO | 2005/034594 A1 | 4/2005 |
| WO | 2010/082248 A1 | 7/2010 |
| WO | 2010/087483 A1 | 8/2010 |
| WO | 2011/024921 A1 | 3/2011 |
| WO | 2013/154497 A2 | 10/2013 |

OTHER PUBLICATIONS

International Search Report and Written Opinion dated Jan. 27, 2015, for the PCT application No. PCT/JP2014/080649.
Japanese Office Action dated Aug. 4, 2015 for the corresponding Japanese application No. 2013-241392 with partial English Translation.
European Search Report dated May 26, 2017 for corresponding European Patent Application No. 14864041.0.
Chinese Office Action dated Nov. 3, 2017 for corresponding Chinese Application No. 201480061865.7 with partial translation.
Japanese Office Action dated Nov. 14, 2017 for corresponding Japanese Application No. 2016-222391 with partial translation.
Japanese Office Action dated Apr. 16, 2019 for the corresponding Japanese application No. 2018-132572, with partial English machine translation.
European official communication pursuant to Art. 94(3) dated Feb. 20, 2019 for the corresponding European Application No. 14864041.0-1211.
Extended European search report dated Jun. 18, 2020 for the corresponding European application No. 20163801.2.
Japanese Office Action dated Apr. 6, 2021, issued in Japanese Patent Application No. 2019-236195, with English machine translation.

(56) References Cited

OTHER PUBLICATIONS

Chinese Office Action dated Apr. 1, 2022, issued in Chinese Application No. 201811131924.X, with English translation.
Chinese Office Action dated Apr. 21, 2022, issued in Chinese Application No. 201811135601.8, with English translation.

* cited by examiner

THROUGH-HOLE ELECTRODE SUBSTRATE

CROSS-REFERENCE TO RELATED APPLICATIONS

This application is a continuation of U.S. patent application Ser. No. 16/743,145, filed on Jan. 15, 2020, which, in turn, is a continuation of U.S. patent application Ser. No. 16/266,203 (now U.S. Pat. No. 10,580,727), filed on Feb. 4, 2019, which, in turn, is a continuation of U.S. patent application Ser. No. 15/159,323 (now U.S. Pat. No. 10,256,176), filed on May 19, 2016, which in turn, is based upon and claims the benefit of priority from Japanese Patent Application No. 2013-241392, filed on Nov. 21, 2013, and PCT Application No. PCT/JP2014/080649, filed on Nov. 19, 2014, the entire contents of which are incorporated herein by reference.

FIELD

The embodiment of the invention is related to a through-hole electrode substrate arranged with a through-hole electrode which passes through a top surface and rear surface of a substrate. In particular, the embodiment of the invention is related to a through-hole electrode substrate used as an interposer substrate for connecting a plurality of elements. In addition, the embodiment of the invention is related to a semiconductor device which uses the through-hole electrode substrate.

BACKGROUND

In recent years, the development of through-hole electrode substrates arranged with a conductive part which conducts a top surface and rear surface of a substrate as an interposer between LSI chips is progressing. This type of through-hole electrode substrate is formed with a through-hole electrode by filling a conductive material using electrolytic plating and the like within a through-hole.

A LSI chip which has a narrow pitch and wiring with short dimensions is arranged on an upper surface of a through-hole electrode substrate. In addition, a semiconductor mounted substrate which has a wide pitch and wiring with long dimensions is arranged on the rear surface of a through-hole electrode substrate. The documents (see, for example, Japanese Patent Application No. 2005-514387, Japanese Patent Application No. 2010-548586, Japanese Patent Application No. 2003-513037, Japanese Patent Application No. 2011-528851, PCT Publication 2010/087483, PCT Publication 2005/034594, PCT Publication 2003/007370, PCT Publication 2011/024921, Japanese Patent No. 4241202 Specification, Japanese Patent No. 4203277 Specification, Japanese Patent No. 4319831 Specification, Japanese Patent No. 4022180 Specification, Japanese Patent No. 4564342 Specification, Japanese Patent No. 4835141 Specification, Japanese Patent No. 5119623 Specification, Japanese Laid Open Patent No. 2009-23341, Japanese Patent No. 2976955 Specification, Japanese Laid Open Patent No. 2003-243396, Japanese Laid Open Patent No. 2003-198069 and Japanese Patent No. 4012375 Specification) are conventional technologies of a through-hole electrode substrate.

In the through-hole electrode, a conductive material is filled into a through-hole as a filler as described above, or a conductive film is formed along the side wall of the through-hole and an insulating resin is filled to the remainder of the through-hole. In the through-hole electrode, a technique is known in which the interior of the through-hole is provided with a taper or a plurality of crater shaped irregularities is formed inside the through-hole in order to prevent dropout of a filler filled in the through-hole (see, for example, Japanese Patent Application No. 2003-513037 and Japanese Patent Application No. 2011-528851).

However, even when attempting to prevent dropout of the filler by such a technique, a gap is generated between the filler and the side wall of the through-hole and a gas reservoir may be generated. When heat is applied to the substrate in this state, in the prior art there is a possibility that gas which has collected into a gas reservoir expands causing destruction of the through-hole or filler which causes defects such as dropout of the filler.

Therefore, the embodiment of the invention has been made in view of such problems and provides a through-hole electrode substrate and semiconductor device which can eliminate defects due to gas collecting in a gas reservoir in a through-hole and allows prevention of dropout of a filler from within the through-hole.

SUMMARY

According to one embodiment of the embodiment of the invention, a through-hole electrode substrate is provided including a substrate including a through-hole extending from a first aperture of a first surface to a second aperture of a second surface, an area of the second aperture being larger than that of the first aperture, the through-hole having a minimum aperture part between the first aperture and the second aperture, wherein an area of the minimum aperture part in a planer view is smallest among a plurality of areas of the through-hole in a planer view, a filler arranged within the through-hole, and at least one gas discharge member contacting the filler exposed to one of the first surface and the second surface.

According to one embodiment of the embodiment of the invention, a through-hole electrode substrate is provided including a substrate including a through-hole extending from a first aperture of a first surface to a second aperture of a second surface, and including a first part and a second part, the second part having a larger area in a planar view than the first part and the first aperture, a filler arranged within the through-hole, and a gas discharge member contacting the filler exposed to one of the first surface and the second surface.

In addition, at least a part of a side wall of the through-hole in a cross-sectional view may include a curve having an inflection point.

The gas discharge member may be an insulation resin configured to discharge gas within the through-hole to the exterior.

At least a part of the gas discharge member may also be arranged between a side wall of the through-hole and the filler.

The gas discharge member may include an aperture having an area increasing in size in a planar view as the aperture separates from the substrate.

A conductive film may be arranged between a side wall of the through-hole and the filler.

An insulation film and a conductive film may be arranged in sequence from a side wall side of the through-hole between a side wall of the through-hole and the filler.

The conductive film may also be arranged on the first surface and on the second surface.

The filler may be a conductive material.
The filler may be an insulation material.

The substrate may have insulation properties.

The substrate may have conductive properties.

The gas discharge member may include an aperture overlapping the first aperture and the second aperture.

The gas discharge member may include an aperture not overlapping the first aperture and the second aperture.

The plurality of gas discharge members may be arranged, one of the plurality of gas discharge members is arranged on the first surface and in contact with a first part of the filler exposed to the first surface, one of the plurality of gas discharge members is arranged on the second surface and in contact with a second part of the filler exposed to the second surface, second part of the filler is larger than an area of the gas discharge member in contact with the first part of the filler.

In addition, according to one embodiment of the embodiment of the invention, a semiconductor device including a through-hole electrode substrate, an LSI substrate and a semiconductor chip.

REFERENCE SIGNS LIST 100, 200, 300, 400: through-hole electrode substrate, 102, 202, 302, 402: substrate, 104, 204, 304, 404: through-hole, 105, 205, 305, 405: filler, 106, 108, 206, 208, 306, 308, 406, 408: insulation layer, 207, 409: conductive film, 307, 407: insulation layer, 110, 112, 210, 212, 310, 312, 410, 412: via (aperture)

DESCRIPTION OF EMBODIMENTS

A through-hole electrode substrate of the embodiment of the invention is explained in detail below while referring to the diagrams. The through-hole electrode substrate of the embodiment of the invention is not limited to the embodiments below and various modifications are possible. In all of the embodiments, the same symbols are attached to the same structural elements and explained.

First Embodiment

Figure 1:
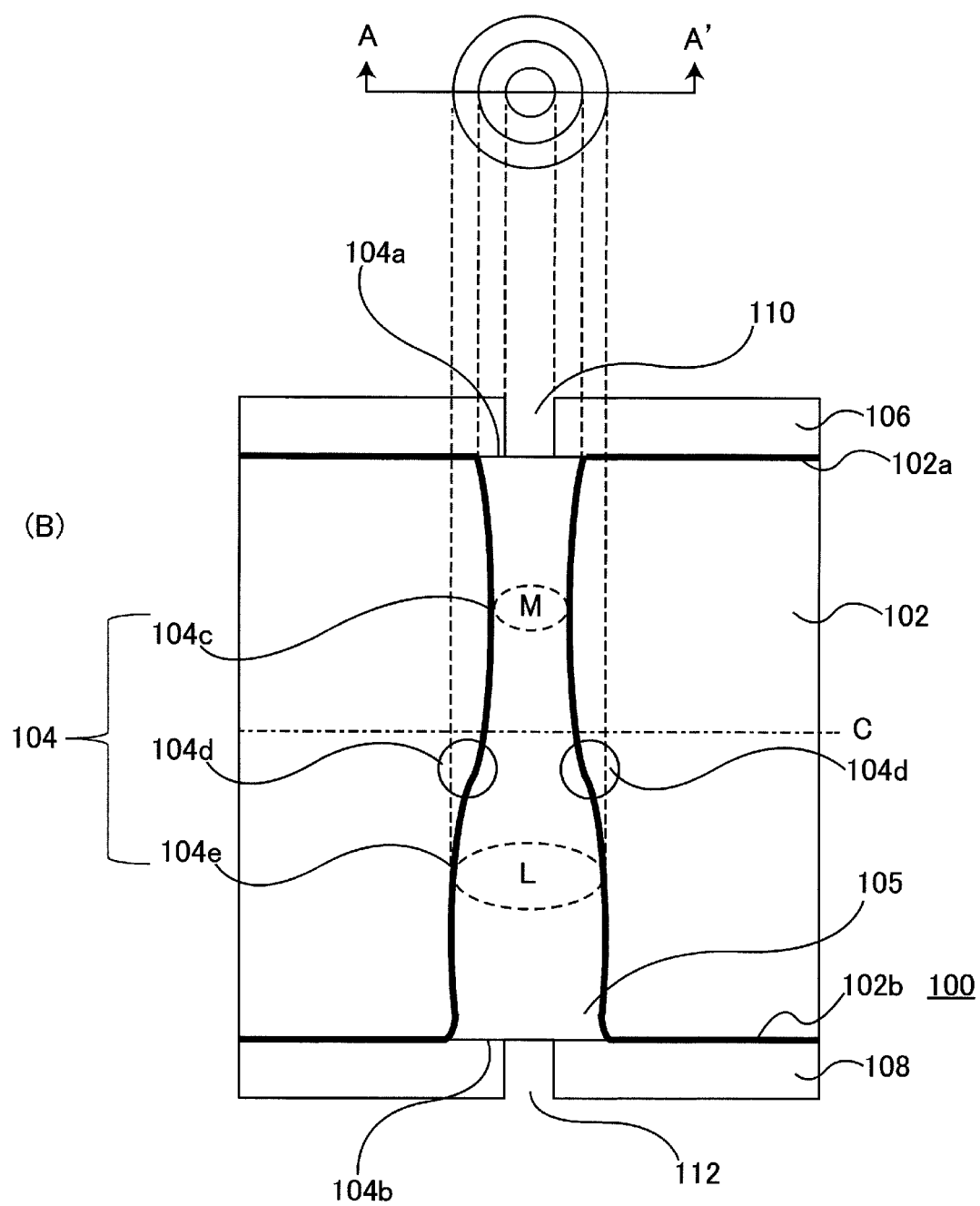
FIG. 1 is a diagram showing a structure of a through-hole electrode substrate 100 of the embodiment of the invention related to a first embodiment.

The structure of a through-hole electrode substrate 100 of the embodiment of the invention related to the present embodiment is explained while referring to FIG. 1. FIG. 1 (A) is a planar diagram of the through-hole electrode substrate 100 of the embodiment of the invention related to the present embodiment seen from the upper surface. FIG. 1 (B) is a cross-sectional diagram of the line A~A' in FIG. 1 (A). Both FIGS. 1 (A) and (B) show a part of the through-hole electrode substrate 100 of the embodiment of the invention related to the present embodiment for the convenience of explanation.

The through-hole electrode substrate 100 of the embodiment of the invention related to the present embodiment is arranged with a substrate 102, a through-hole 104, a filler 105, insulation layers 106 and 108, and via's 110 and 112. Furthermore, a wiring structure body and electronic components and the like may also be further mounted respectively on a first surface 102a and second surface 102b side of the substrate 102.

In the present embodiment, the substrate 102 includes insulation properties, for example it is possible to use glass, sapphire or resin and the like. Although there is no particular limitation to the thickness of the substrate 102, it is possible to appropriately set the thickness to a range of 10 μm~1 mm for example.

The through-hole 104 is a through-hole which passes through a first aperture 104a arranged in the first surface 102a of the substrate and a second aperture 104b arranged in the second surface 102b which is the opposite side surface to the first surface 102a. The shape of the through-hole 104 is not constant and changes from the first aperture 104a towards the second aperture 104b. In other words, the shape of the side wall of the through-hole 104 is not constant and changes from the first aperture 104a towards the second aperture 104b. Typically, the second aperture 104b is larger than the first aperture 104a and the through-hole 104 includes a narrow part between the first aperture 104a and second aperture 104b. More specifically, the through-hole 104 includes a minimum aperture part 104c having a minimum area M in a planar view (that is, seen from the upper surface), an inflection point 104d (curved line including the inflection point 104d) at which a side wall of the through-hole 104 changes according to a curved line in a cross-sectional view (that is, seen along the cross-section A~A'), and a maximum aperture part 104e having a maximum area L in a planar view (that is, seen from the upper surface). In the present embodiment, although the inflection point 104d of the through-hole 104 is arranged nearer to the second aperture 104b than the center of the through-hole 104, the present embodiment is not limited to this and the inflection point 104d of the through-hole 104 may also be arranged nearer to the first aperture 104a than the center of the through-hole 104. Furthermore, it is possible to form the through-hole 104 by performing an etching process, laser process and sandblast process of the substrate 102. Although there is no particular limitation to the size of the through-hole 104, it is preferred that the size of the maximum aperture part 104e is set to 200 μm or less in order to realize a narrow pitch.

The filler 105 is arranged within the through-hole 104. In the present embodiment, the filler 105 is a material with conductive properties, for example, a metal deposit such as Cu, a conductive paste including Cu, and a conductive material such as a conductive resin can be used. An electrolytic plating filler method is used in the case where a metal such as Cu is used as the filler 105. In the case where a conductive paste having fluidity is used as the filler 105 or a conductive resin is used as the material, it is possible to fill the through-hole 104 with a conductive paste or conductive resin using a spatula or scriber and subsequently form the filler 105 by performing a heating process or the like.

The insulation layers 106 and 108 are respectively arranged directly or via an intermediate layer (not shown in the diagram) above the first surface 102a and second surface 102b of the substrate 102. The insulation layers 106 and 108 are formed from a resin material with insulation properties such as polyimide or benzocyclobutene for example, and may be an insulator having a gas discharge function. The insulation layers 106 and 108 work as a gas discharge member by discharging (allowing gas to pass through) gas generated and discharged within the through-hole 104 to the exterior. At least one of the insulation layers (gas discharge member) 106 and 108 is arranged so as to contact the filler 105 exposed to the first surface 102a and second surface 102b of the substrate 102. In addition, in the case where a gap exists between the side wall of the through-hole 104 and the filler 105, a part of the insulation layers (gas discharge member) 106 and 108 may be arranged between the side wall of the through-hole 104 and the filler 105, that is, the insulation layers 106 and 108 may enter between the side wall of the through-hole 104 and the filler 105. The insulation layers 106 and 108 are formed by a desired patterning using photolithography using a photosensitive material with insulation properties for example.

In the through-hole electrode substrate 100 of the embodiment of the invention related to the present embodiment, as described above, the through-hole 104 includes a minimum aperture part 104c, inflection point 104d and maximum aperture part 104e. In addition, the filler 105 is filled into the through-hole 104. In the case shown in FIG. 1, there is a larger amount of the filler 105 in the part of the through-hole 104 on the second surface 102b side than the part of the through-hole 104 on the first surface 102a side and due to this the amount of gas which is discharged increases. The area where the gas discharge member 108 of the second surface 102b side contacts the filler 105 increases more than the area where the gas discharge member 106 of the first surface 102a side contacts the filler 105, and the amount of gas discharged from the gas discharge member 108 of the second surface side may be set to increase. Furthermore, since the second aperture 104b is larger than the first aperture 104a, it is possible to easily obtain the contact surface relationship described above by setting the diameter of the via 110 and via 112 roughly the same.

The via 110 and via 112 which are apertures, are holes formed respectively in the insulation layers (gas discharge members) 106 and 108. Although not shown in the diagram for the convenience of explanation, wiring is formed in the via 110 and 112 by plating or sputtering. This wiring contacts with the filler 105 arranged within the through-hole 104 and the wiring conducts with each other. As is shown in FIG. 1 (B), the via 110 and 112 which are apertures in the insulation layers (gas discharge member) 106 and 108 are formed respectively overlapping a first aperture and a second aperture of the substrate 102. In other words, the via 110 and 112 which are apertures in the insulation layers (gas discharge member) 106 and 108 are respectively arranged directly above the first aperture and second aperture of the substrate 102. In addition, a part of the via 110 and/or the via 112 which are apertures in the insulation layers (gas discharge member) 106 and 108 may be formed so as to overlap the first aperture 104a and second aperture 104b of the substrate 102 respectively.

In the through-hole electrode substrate 100 of the embodiment of the invention related to the present embodiment, as described above, the through-hole 104 includes a minimum aperture part 104c, inflection point 104d and maximum aperture part 104e. In addition, the filler 105 is filled into the through-hole 104. It is possible to secure filler properties of the filler by making the size of the first aperture 104a and second aperture 104b different. In addition, in the case where a force is applied to the filler 105 in the direction of the first surface 102a, it is possible to prevent the filler 105 from dropping out of the substrate 102 due to the presence of the inflection point 104d. In addition, in the case where a force is applied to the filler 105 in the direction of the second surface 102b, it is possible to prevent the filler 105 from dropping out of the substrate 102 due to the presence of the minimum aperture part 104c. Furthermore, the through-hole electrode substrate 100 related to the present embodiment may include both or only one of either the minimum aperture part 104c and maximum aperture part 104e. Therefore, in the through-hole electrode substrate 100 of the embodiment of the invention related to the present embodiment, it is possible to secure filler properties of the filler 105 and prevent the filler 105 from dropping in either an upwards or downwards direction.

In addition, in the through-hole electrode substrate 100 of the embodiment of the invention related to the present embodiment, as described above, at least one of the insulation layers (gas discharge member) 106 and 108 is arranged so as to contact with the filler 105 exposed to the first surface 102a and second surface 102b of the substrate 102. Therefore, it is possible for the insulation layer (gas discharge member) 106 and/or 108 to discharge gas generated and discharged within the through-hole 104 to the exterior, remove defects caused by accumulated gas in a gas reservoir within the through-hole 104, it is possible to prevent the filler 105 from dropping out from the through-hole 104, and it is possible to provide a through-hole electrode substrate with a high level of reliability.

Furthermore, although it preferred that there is no gap between the side wall of the through-hole 104 and the filler 105, a slight gap or interval may be produced between the side wall of the through-hole 104 and the filler 105. Even in the case where this type of gap or interval is produced, it is possible to prevent the filler 105 from dropping out in the through-hole electrode substrate 100 of the embodiment of the invention related to the present embodiment.

Second Embodiment

Figure 2:
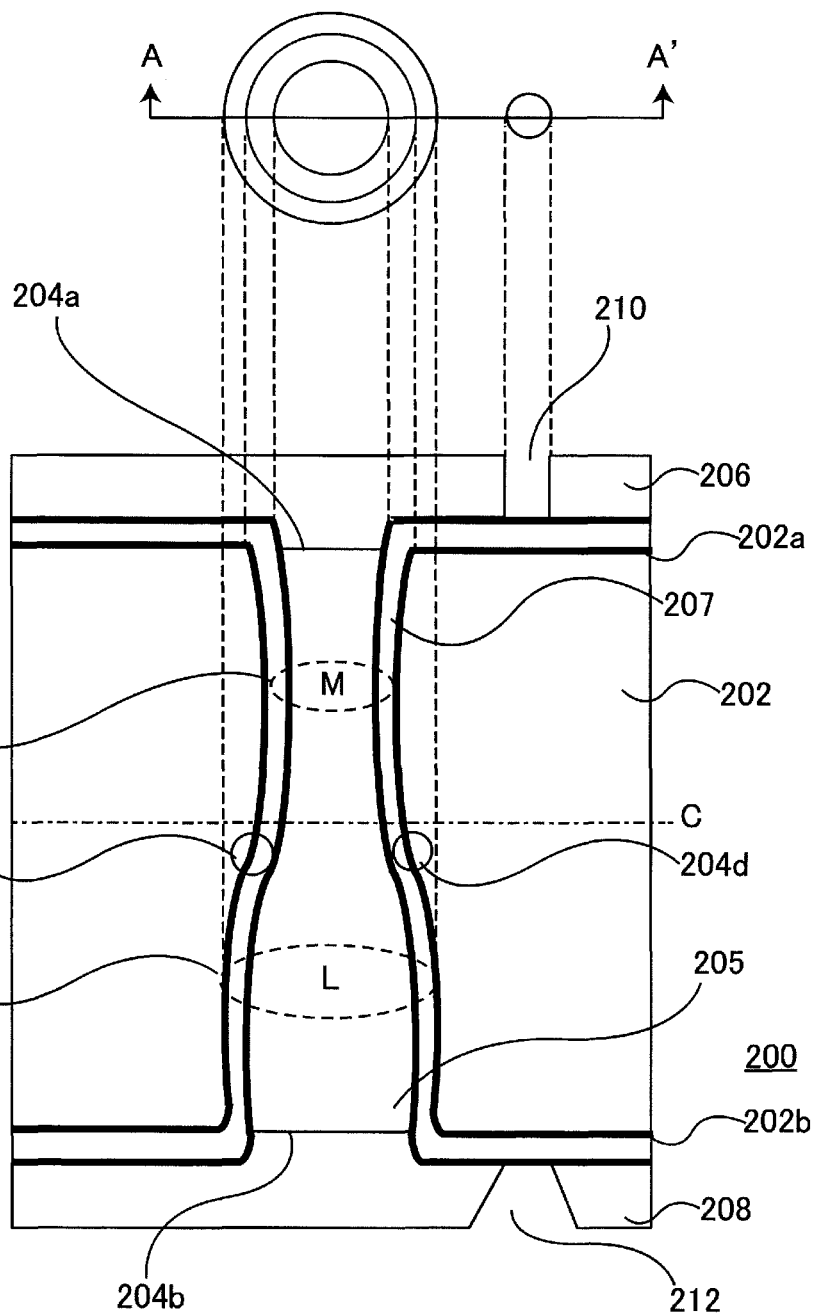
FIG. 2 is a diagram showing a structure of a through-hole electrode substrate 200 of the embodiment of the invention related to a second embodiment.

The structure of a through-hole electrode substrate 200 of the embodiment of the invention related to the present embodiment is explained while referring to FIG. 2. FIG. 2 (A) is a planar diagram of the through-hole electrode substrate 200 of the embodiment of the invention related to the present embodiment seen from the upper surface. FIG. 2 (B) is a cross-sectional diagram of the line A~A' in FIG. 2 (A). Both FIGS. 2 (A) and (B) show a part of the through-hole electrode substrate 200 of the embodiment of the invention related to the present embodiment for the convenience of explanation.

The through-hole electrode substrate 200 of the embodiment of the invention related to the present embodiment is arranged with a substrate 202, a through-hole 204, a filler 205, insulation layers 206 and 208, and via's 210 and 212. Furthermore, a wiring structure body and electronic components and the like may also be further mounted respectively on a first surface 202a and second surface 202b side of the substrate 202.

In the present embodiment, the substrate 202 includes insulation properties, for example it is possible to use glass, sapphire or resin and the like. Although there is no particular limitation to the thickness of the substrate 202, it is possible to appropriately set the thickness to a range of 10 μm~1 mm for example.

The through-hole 204 is a through-hole which passes through a first aperture 204a arranged in the first surface 202a of the substrate 202 and a second aperture 204b arranged in the second surface 202b which is the opposite side surface to the first surface 202a. The shape of the through-hole 204 is not constant and changes from the first aperture 204a towards the second aperture 204b the same as in the first embodiment described above. In other words, the shape of the side wall of the through-hole 204 is not constant and changes from the first aperture 204a towards the second aperture 204b. Typically, the second aperture 204b is larger than the first aperture 204a and the through-hole 204 includes a narrow part between the first aperture 204a and second aperture 204b. More specifically, the through-hole 204 includes a minimum aperture part 204c having a minimum area M in a planar view (that is, seen from the upper surface), an inflection point 204d (curved line including the inflection point 204d) at which a side wall of the through-hole 204 changes according to a curved line in a cross-sectional view (that is, seen along the cross-section A~A'), and a maximum aperture part 204e having a maximum area L in a planar view (that is, seen from the upper surface). In the present embodiment, although the inflection point 204d of the through-hole 204 is arranged nearer to the second aperture 204b than the center of the through-hole 204, the present embodiment is not limited to this and the inflection point 204d of the through-hole 204 may also be arranged nearer to the first aperture 204a than the center of the through-hole 204. Furthermore, it is possible to form the through-hole 204 by performing an etching process, laser process and sandblast process of the substrate 202. Although there is no particular limitation to the size of the through-hole 204, it is preferred that the size of the maximum aperture part 204e is set to 200 μm or less in order to realize a narrow pitch.

A conductive film 207 and the filler 205 are arranged within the through-hole 204. The conductive film 207 is arranged on the side wall side of the through-hole 204 and a part of the conductive film 207 is arranged on an upper part of the first surface 202a and second surface 202b. In the present embodiment, the filler 205 is a material with insulation properties, for example, an organic material such as polyimide or benzocyclobutene or an inorganic material such as silicon oxide or silicon nitride is used. The conductive film 207 can be formed using a plating method or CVD method for example. The filler 205 can be formed using a method such as absorption or pushing method.

The insulation layers 206 and 208 are respectively arranged directly or via an intermediate layer (not shown in the diagram) above the first surface 202a and second surface 202b of the substrate 202. The insulation layers 206 and 208 are formed from a resin material with insulation properties such as polyimide or benzocyclobutene for example, and may be an insulator having a gas discharge function. The insulation layers 206 and 208 work as a gas discharge member by discharging (allowing gas to pass through) gas generated and discharged within the through-hole 204 to the exterior. In the present embodiment, the insulation layers (gas discharge member) 206 and 208 are arranged so as to cover and contact the filler 205 which is exposed to the first surface 202a and second surface 202b of the substrate 202. At least one of the insulation layers (gas discharge member) 206 and 208 is arranged so as to contact the filler 205 exposed to the first surface 202a and second surface 202b of the substrate 202. In addition, in the case where a gap exists between the side wall of the through-hole 204 and the filler 205, a part of the insulation layers (gas discharge member) 206 and 208 may be arranged between the side wall of the through-hole 204 and the filler 205, that is, the insulation layers 206 and 208 may enter between the side wall of the through-hole 204 and the filler 205. The insulation layers 206 and 208 are formed by a desired patterning using photolithography using a photosensitive material with insulation properties for example.

In the through-hole electrode substrate 200 of the embodiment of the invention related to the present embodiment, as described above, the through-hole 204 includes a minimum aperture part 204c, inflection point 204d and maximum aperture part 204e. In addition, the filler 205 is filled into the through-hole 204. In the case shown in FIG. 2, there is a larger amount of the filler 205 in the part of the through-hole 204 on the second surface 202b side than the part of the through-hole 204 on the first surface 202a side and due to this the amount of gas which is discharged increases. Therefore, the area where the gas discharge member 208 of the second surface 202b side contacts the filler 205 increases more than the area where the gas discharge member 206 of the first surface 202a side contacts the filler 205, and the amount of gas discharged from the gas discharge member 208 of the second surface side may be set to increase.

The via 210 and via 212 which are apertures, are holes formed respectively in the insulation layers (gas discharge members) 206 and 208 above the conductive film 207 above the first surface 202a and second surface 202b. Although not shown in the diagram for the convenience of explanation, wiring is formed in the via 210 and 212 by plating or sputtering. This wiring contacts with the conductive film 207 above the first surface 202a and above the second surface 202b and the wiring conducts with each other. In addition, a part of the via 210 and/or the via 212 which are apertures in the insulation layers (gas discharge member) 206 and 208 may be formed so as to overlap the first aperture 204a and second aperture 204b of the substrate 202 respectively.

In the through-hole electrode substrate 200 of the embodiment of the invention related to the present embodiment, as described above, the through-hole 204 includes a minimum aperture part 204c, inflection point 204d and maximum aperture part 204e. In addition, the filler 205 is filled into the through-hole 204. It is possible to secure filler properties of the filler by making the size of the first aperture 204a and second aperture 204b different. In addition, in the case where a force is applied to the filler 205 in the direction of the first surface 202a, it is possible to prevent the filler 205 from dropping out of the substrate 202 due to the presence of the inflection point 204d. In addition, in the case where a force is applied to the filler 205 in the direction of the second surface 202b, it is possible to prevent the filler 205 from dropping out of the substrate 202 due to the presence of the minimum aperture part 204c. Furthermore, the through-hole electrode substrate 200 related to the present embodiment may include both or only one of either the minimum aperture part 204c and maximum aperture part 204e. Therefore, in the through-hole electrode substrate 200 of the embodiment of the invention related to the present embodiment, it is possible to secure filler properties of the filler 205 and prevent the filler 205 from dropping in either an upwards or downwards direction.

In addition, in the through-hole electrode substrate 200 of the embodiment of the invention related to the present embodiment, as described above, at least one of the insulation layers (gas discharge member) 206 and 208 is arranged so as to contact with the filler 205 exposed to the first surface 202a and second surface 202b of the substrate 202. Therefore, it is possible for the insulation layer (gas discharge member) 206 and/or 208 to discharge gas generated and discharged within the through-hole 204 to the exterior, remove defects caused by accumulated gas in a gas reservoir within the through-hole 204, it is possible to prevent the filler 205 from dropping out from the through-hole 204, and it is possible to provide a through-hole electrode substrate with a high level of reliability.

Furthermore, although it preferred that there is no gap between the conductive film 207 arranged in the side wall of the through-hole 204 and the filler 205, a slight gap or interval may be produced between conductive film 207 and the filler 205. Even in the case where this type of gap or interval is produced, it is possible to prevent the filler 205 from dropping out in the through-hole electrode substrate 200 of the embodiment of the invention related to the present embodiment.

Third Embodiment

Figure 3:
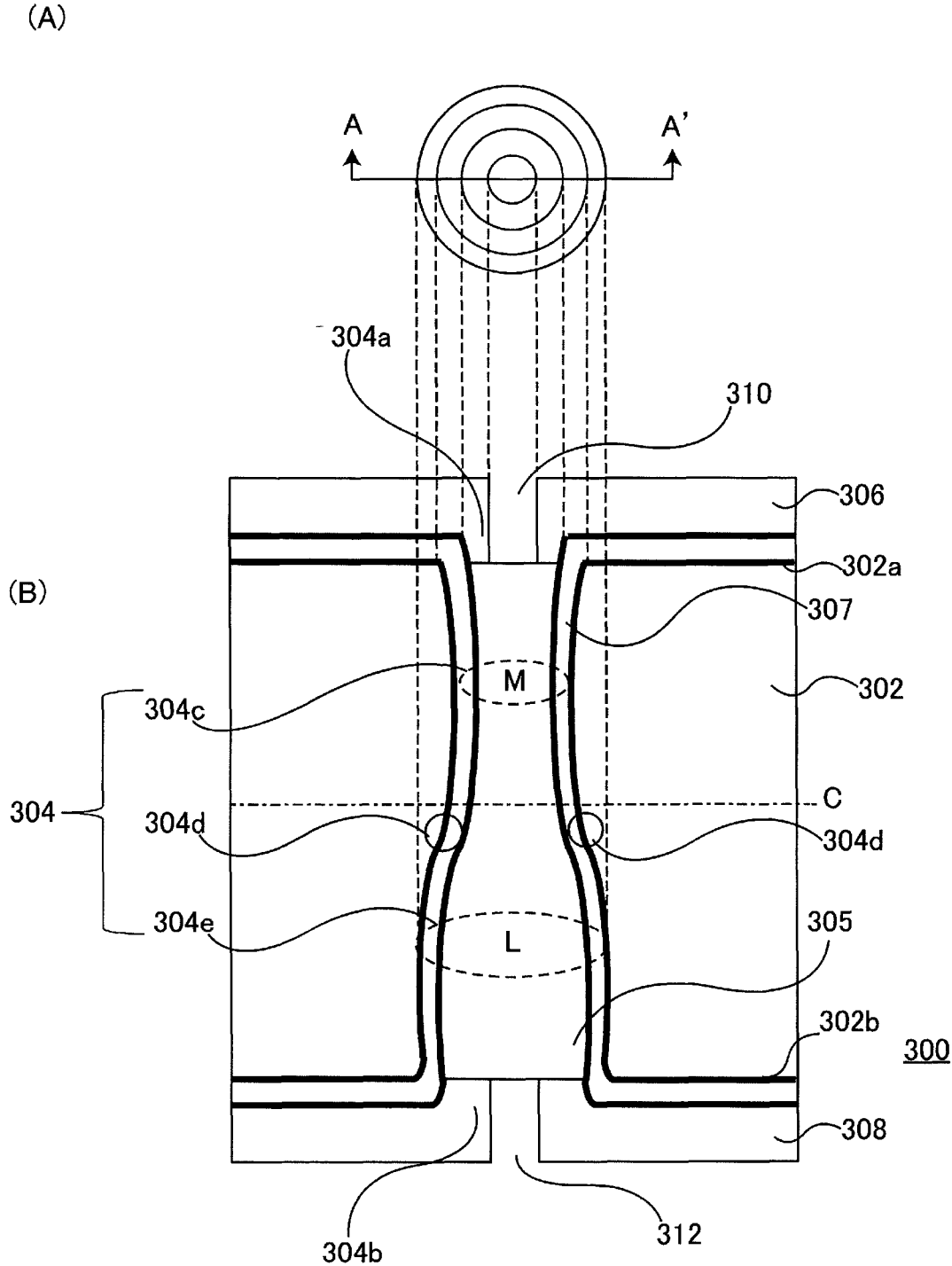
FIG. 3 is a diagram showing a structure of a through-hole electrode substrate 300 of the embodiment of the invention related to a third embodiment.

The structure of a through-hole electrode substrate 300 of the embodiment of the invention related to the present embodiment is explained while referring to FIG. 3. FIG. 3 (A) is a planar diagram of the through-hole electrode substrate 300 of the embodiment of the invention related to the present embodiment seen from the upper surface. FIG. 3 (B) is a cross-sectional diagram of the line A~A' in FIG. 3 (A). Both FIGS. 3 (A) and (B) show a part of the through-hole electrode substrate 300 of the embodiment of the invention related to the present embodiment for the convenience of explanation.

The through-hole electrode substrate 300 of the embodiment of the invention related to the present embodiment is arranged with a substrate 302, a through-hole 304, a filler 305, insulation layers 306 and 308, and via's 310 and 312. Furthermore, a wiring structure body and electronic components and the like may also be further mounted respectively on a first surface 302a and second surface 302b side of the substrate 302.

In the present embodiment, the substrate 302 includes conductive properties, for example it is possible to use a silicon semiconductor or metal such as stainless steel and the like. Although there is no particular limitation to the thickness of the substrate 302, it is possible to appropriately set the thickness to a range of 10 μm~1 mm for example.

The through-hole 304 is a through-hole which passes through a first aperture 304a arranged in the first surface 302a of the substrate 302 and a second aperture 304b arranged in the second surface 302b which is the opposite side surface to the first surface 302a the same as in the first and second embodiments described above. The shape of the through-hole 304 is not constant and changes from the first aperture 304a towards the second aperture 304b. In other words, the shape of the side wall of the through-hole 304 is not constant and changes from the first aperture 304a towards the second aperture 304b. Typically, the second aperture 304b is larger than the first aperture 304a and the through-hole 304 includes a narrow part between the first aperture 304a and second aperture 304b. More specifically, the through-hole 304 includes a minimum aperture part 304c having a minimum area M in a planar view (that is, seen from the upper surface), an inflection point 304d (curved line including the inflection point 304d) at which a side wall of the through-hole 304 changes according to a curved line in a cross-sectional view (that is, seen along the cross-section A~A'), and a maximum aperture part 304e having a maximum area L in a planar view (that is, seen from the upper surface). In the present embodiment, although the inflection point 304d of the through-hole 304 is arranged nearer to the second aperture 304b than the center of the through-hole 304, the present embodiment is not limited to this and the inflection point 304d of the through-hole 304 may also be arranged nearer to the first aperture 304a than the center of the through-hole 304. Furthermore, it is possible to form the through-hole 304 by performing an etching process, laser process and sandblast process of the substrate 302. Although there is no particular limitation to the size of the through-hole 304, it is preferred that the size of the maximum aperture part 304e is set to 200 μm or less in order to realize a narrow pitch.

The insulation layer 307 and the filler 305 are arranged within the through-hole 304. The insulation layer 307 is arranged on the side wall side of the through-hole 304 and a part of the insulation layer 307 is arranged on an upper part of the first surface and second surface of the substrate 302. In the present embodiment, the filler 305 is a material with conductive properties, for example, a metal deposit such as Cu, a conductive paste including Cu, and a conductive material such as a conductive resin can be used. An electrolytic plating filler method is used in the case where a metal such as Cu is used as the filler 305. In the case where a conductive paste having fluidity is used as the filler 305 or a conductive resin is used as the material, it is possible to fill the through-hole 304 with a conductive paste or conductive resin using a spatula or scriber and subsequently form the filler 305 by performing a heating process or the like.

The insulation layers 306 and 308 are respectively arranged directly or via an intermediate layer (not shown in the diagram) above the first surface 302a and second surface 302b of the substrate 302. The insulation layers 306 and 308 are formed from a resin material with insulation properties such as polyimide or benzocyclobutene for example, and may be an insulator having a gas discharge function. The insulation layers 306 and 308 work as a gas discharge member by discharging (allowing gas to pass through) gas generated and discharged within the through-hole 304 to the exterior. At least one of the insulation layers (gas discharge member) 306 and 308 is arranged so as to contact the filler 305 exposed to the first surface and second surface of the substrate 302. In addition, in the case where a gap exists between the side wall of the through-hole 304 and the filler 305, a part of the insulation layers (gas discharge member) 306 and 308 may be arranged between the side wall of the through-hole 304 and the filler 305, that is, the insulation layers 306 and 308 may enter between the side wall of the through-hole 304 and the filler 305. The insulation layers 306 and 308 are formed by a desired patterning using photolithography using a photosensitive material with insulation properties for example.

In the through-hole electrode substrate 300 of the embodiment of the invention related to the present embodiment, as described above, the through-hole 304 includes a minimum aperture part 304c, inflection point 304d and maximum aperture part 304e. In addition, the filler 305 is filled into the through-hole 304. In the case shown in FIG. 3, there is a larger amount of the filler 305 in the part of the through-hole 304 on the second surface 302b side than the part of the through-hole 304 on the first surface 302a side and due to this the amount of gas which is discharged increases. Therefore, the area where the gas discharge member 308 of the second surface side contacts the filler 305 increases more than the area where the gas discharge member 306 of the first surface 302a side contacts the filler 305, and the amount of gas discharged from the gas discharge member 308 of the second surface 302b side may be set to increase. Furthermore, since the second aperture 304b is larger than the first aperture 304a, it is possible to easily obtain the contact surface relationship described above by setting the diameter of the via 310 and via 312 roughly the same.

The via 310 and via 312 which are apertures, are holes formed respectively in the insulation layers (gas discharge members) 306 and 308. Although not shown in the diagram for the convenience of explanation, wiring is formed in the via 310 and 312 by plating or sputtering. This wiring contacts with the filler 305 arranged within the through-hole 304 and the wiring conducts with each other. As is shown in FIG. 3 (B), the via 310 and 312 which are apertures in the insulation layers (gas discharge member) 306 and 308 are formed respectively overlapping the first aperture 304a and the second aperture 304b of the substrate 302. In other words, the via 310 and 312 which are apertures in the insulation layers (gas discharge member) 306 and 308 are respectively arranged directly above the first aperture 304a and second aperture 304b of the substrate 302. In addition, a part of the via 310 and/or the via 312 which are apertures in the insulation layers (gas discharge member) 306 and 308 may be formed so as to overlap the first aperture 304a and second aperture 304b of the substrate 302 respectively.

In the through-hole electrode substrate 300 of the embodiment of the invention related to the present embodiment, as described above, the through-hole 304 includes a minimum aperture part 304c, inflection point 304d and maximum aperture part 304e. In addition, the filler 305 is filled into the through-hole 304. It is possible to secure filler properties of the filler by making the size of the first aperture 304a and second aperture 304b different. In addition, in the case where a force is applied to the filler 305 in the direction of the first surface 302a, it is possible to prevent the filler 305 from dropping out of the substrate 302 due to the presence of the inflection point 304d. In addition, in the case where a force is applied to the filler 305 in the direction of the second surface 302b, it is possible to prevent the filler 305 from dropping out of the substrate 302 due to the presence of the minimum aperture part 304c. Furthermore, the through-hole electrode substrate 300 related to the present embodiment may include both or only one of either the minimum aperture part 304c and maximum aperture part 304e. Therefore, in the through-hole electrode substrate 300 of the embodiment of the invention related to the present embodiment, it is possible to secure filler properties of the filler 305 and prevent the filler 305 from dropping in either an upwards or downwards direction.

In addition, in the through-hole electrode substrate 300 of the embodiment of the invention related to the present embodiment, as described above, at least one of the insulation layers (gas discharge member) 306 and 308 is arranged so as to contact with the filler 305 exposed to the first surface 302a and second surface 302b of the substrate 302. Therefore, it is possible for the insulation layer (gas discharge member) 306 and/or 308 to discharge gas generated and discharged within the through-hole 304 to the exterior, remove defects caused by accumulated gas in a gas reservoir within the through-hole 304, it is possible to prevent the filler 305 from dropping out from the through-hole 304, and it is possible to provide a through-hole electrode substrate with a high level of reliability.

Furthermore, although it preferred that there is no gap between the insulation layer 307 arranged in the side wall of the through-hole 304 and the filler 305, a slight gap or interval may be produced between the insulation layer 307 and the filler 305. Even in the case where this type of gap or interval is produced, it is possible to prevent the filler 305 from dropping out in the through-hole electrode substrate 300 of the embodiment of the invention related to the present embodiment.

Fourth Embodiment

Figure 4:
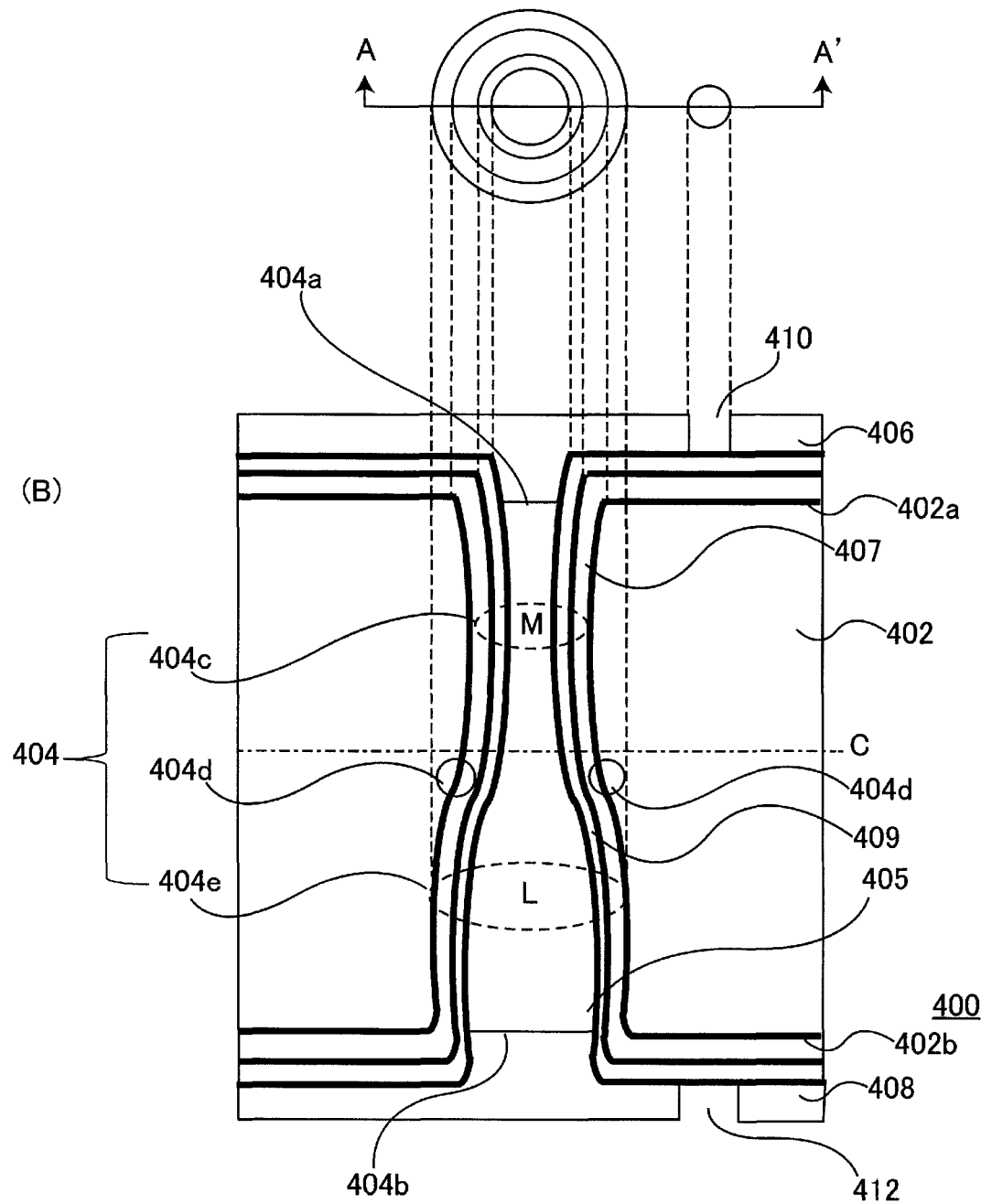
FIG. 4 is a diagram showing a structure of a through-hole electrode substrate 400 of the embodiment of the invention related to a fourth embodiment.

The structure of a through-hole electrode substrate 400 of the embodiment of the invention related to the present embodiment is explained while referring to FIG. 4. FIG. 4 (A) is a planar diagram of the through-hole electrode substrate 400 of the embodiment of the invention related to the present embodiment seen from the upper surface. FIG. 4 (B) is a cross-sectional diagram of the line A~A' in FIG. 4 (A). Both FIGS. 4 (A) and (B) show a part of the through-hole electrode substrate 400 of the embodiment of the invention related to the present embodiment for the convenience of explanation.

The through-hole electrode substrate 400 of the embodiment of the invention related to the present embodiment is arranged with a substrate 402, a through-hole 404, a filler 405, insulation layers 406 and 408, insulation film 407, a conductive film 409, and via's 410 and 412. Furthermore, a wiring structure body and electronic components and the like may also be further mounted respectively on a first surface 402a and second surface 402b side of the substrate 402.

In the present embodiment, the substrate 402 includes conductive properties, for example it is possible to use a silicon semiconductor or metal such as stainless steel and the like. Although there is no particular limitation to the thickness of the substrate 402, it is possible to appropriately set the thickness to a range of 10 μm~1 mm for example.

The through-hole 404 is a through-hole which passes through a first aperture 404a arranged in the first surface 402a of the substrate 402 and a second aperture 404b arranged in the second surface 402b which is the opposite side surface to the first surface 402a. The shape of the through-hole 404 is not constant and changes from the first aperture 404a towards the second aperture 404b the same as the first to third embodiments described above. In other words, the shape of the side wall of the through-hole 404 is not constant and changes from the first aperture 404a towards the second aperture 404b. Typically, the second aperture 404b is larger than the first aperture 404a and the through-hole 404 includes a narrow part between the first aperture 404a and second aperture 404b. More specifically, the through-hole 404 includes a minimum aperture part 404c having a minimum area M in a planar view (that is, seen from the upper surface), an inflection point 404d (curved line including the inflection point 404d) at which a side wall of the through-hole 404 changes according to a curved line in a cross-sectional view (that is, seen along the cross-section A~A'), and a maximum aperture part 404e having a maximum area L in a planar view (that is, seen from the upper surface). In the present embodiment, although the inflection point 404d of the through-hole 404 is arranged nearer to the second aperture 404b than the center of the through-hole 404, the present embodiment is not limited to this and the inflection point 404d of the through-hole 404 may also be arranged nearer to the first aperture 404a than the center of the through-hole 404. Furthermore, it is possible to form the through-hole 404 by performing an etching process, laser process and sandblast process of the substrate 402. Although there is no particular limitation to the size of the through-hole 404, it is preferred that the size of the maximum aperture part 404e is set to 200 μm or less in order to realize a narrow pitch.

An insulation layer 407, conductive film 409 and the filler 405 are arranged within the through-hole 404. The insulation layer 407 is arranged on the side wall side of the through-hole 404, and a part of the insulation layer 407 is arranged on an upper part of the first surface and second surface of the substrate 402. The conductive film 409 is arranged on the insulation layer 407 side of the through-hole 404 and a part of the conductive film 409 is arranged on an upper part of the first surface and second surface of the substrate 402. In the present embodiment, the filler 405 is a material with insulation properties, for example, an organic material such as polyimide or benzocyclobutene or an inorganic material such as silicon oxide or silicon nitride is used. The conductive film 409 can be formed using a plating method or CVD method for example. The filler 405 can be formed using a method such as absorption or pushing method.

The insulation layers 406 and 408 are respectively arranged directly or via an intermediate layer (not shown in the diagram) above the first surface 402a and second surface 402b of the substrate 402. The insulation layers 406 and 408 are formed from a resin material with insulation properties such as polyimide and may be an insulator having a gas discharge function. The insulation layers 406 and 408 work as a gas discharge member by discharging (allowing gas to pass through) gas generated and discharged within the through-hole 404 to the exterior. In the present embodiment, the insulation layers (gas discharge member) 406 and 408 are arranged to cover and contact the filler 405 exposed to the first surface and second surface of the substrate 402. At least one of the insulation layers (gas discharge member) 406 and 408 is arranged so as to contact the filler 405 exposed to the first surface 402a and second surface 402b of the substrate 402. In addition, in the case where a gap exists between the side wall of the through-hole 404 and the filler 405, a part of the insulation layers (gas discharge member) 406 and 408 may be arranged between the side wall of the through-hole 404 and/or the insulation layer 407 and the filler 405, that is, the insulation layers 406 and 408 may enter between the side wall of the through-hole 404 and the filler 405. The insulation layers 406 and 408 are formed by a desired patterning using photolithography using a photosensitive material with insulation properties for example.

In the through-hole electrode substrate 400 of the embodiment of the invention related to the present embodiment, as described above, the through-hole 404 includes a minimum aperture part 404c, inflection point 404d and maximum aperture part 404e. In addition, the filler 405 is filled into the through-hole 404. In the case shown in FIG. 4, there is a larger amount of the filler 405 in the part of the through-hole 404 on the second surface 402b side than the part of the through-hole 404 on the first surface 402a side and due to this the amount of gas which is discharged increases. Therefore, the area where the gas discharge member 408 of the second surface 402b side contacts the filler 405 increases more than the area where the gas discharge member 406 of the first surface 402a side contacts the filler 405, and the amount of gas discharged from the gas discharge member 408 of the second surface side may be set to increase. Furthermore, since the second aperture 404b is larger than the first aperture 404a, it is possible to easily obtain the contact surface relationship described above by setting the diameter of the via 410 and via 412 roughly the same.

The via 410 and via 412 which are apertures, are holes formed respectively in the insulation layers (gas discharge members) 406 and 408 above the conductive film 409 above the first surface and second surface. Although not shown in the diagram for the convenience of explanation, wiring is formed in the via 410 and 412 by plating or sputtering. This wiring contacts with the conductive film 409 above the first surface 402a and above the second surface 402b and the wiring conducts with each other. In addition, a part of the via 410 and/or the via 412 which are apertures in the insulation layers (gas discharge member) 406 and 408 may be formed so as to overlap the first aperture 404a and second aperture 404b of the substrate 402 respectively.

In the through-hole electrode substrate 400 of the embodiment of the invention related to the present embodiment, as described above, the through-hole 404 includes a minimum aperture part 404c, inflection point 404d and maximum aperture part 404e. In addition, the filler 405 is filled into the through-hole 404. It is possible to secure filler properties of the filler by making the size of the first aperture 404a and second aperture 404b different. In addition, in the case where a force is applied to the filler 405 in the direction of the first surface 402a, it is possible to prevent the filler 405 from dropping out of the substrate 402 due to the presence of the inflection point 404d. In addition, in the case where a force is applied to the filler 405 in the direction of the second surface, it is possible to prevent the filler 405 from dropping out of the substrate 402 due to the presence of the minimum aperture part 404c. Furthermore, the through-hole electrode substrate 400 related to the present embodiment may include both or only one of either the minimum aperture part 404c and maximum aperture part 404e. Therefore, in the through-hole electrode substrate 400 of the embodiment of the invention related to the present embodiment, it is possible to secure filler properties of the filler 405 and prevent the filler 405 from dropping in either an upwards or downwards direction.

In addition, in the through-hole electrode substrate 400 of the embodiment of the invention related to the present embodiment, as described above, at least one of the insulation layers (gas discharge member) 406 and 408 is arranged so as to contact with the filler 405 exposed to the first surface 402a and second surface 402b of the substrate 402. Therefore, it is possible for the insulation layer (gas discharge member) 406 and/or 408 to discharge gas generated and discharged within the through-hole 404 to the exterior, remove defects caused by accumulated gas in a gas reservoir within the through-hole 404, it is possible to prevent the filler 405 from dropping out from the through-hole 404, and it is possible to provide a through-hole electrode substrate with a high level of reliability.

Furthermore, although it preferred that there is no gap between the conductive film 409 arranged in the through-hole 404 and the filler 405, a slight gap or interval may be produced between the conductive film 409 and the filler 405. Even in the case where this type of gap or interval is produced, it is possible to prevent the filler 405 from dropping out in the through-hole electrode substrate 400 of the embodiment of the invention related to the present embodiment.

Fifth Embodiment

Figure 5A:
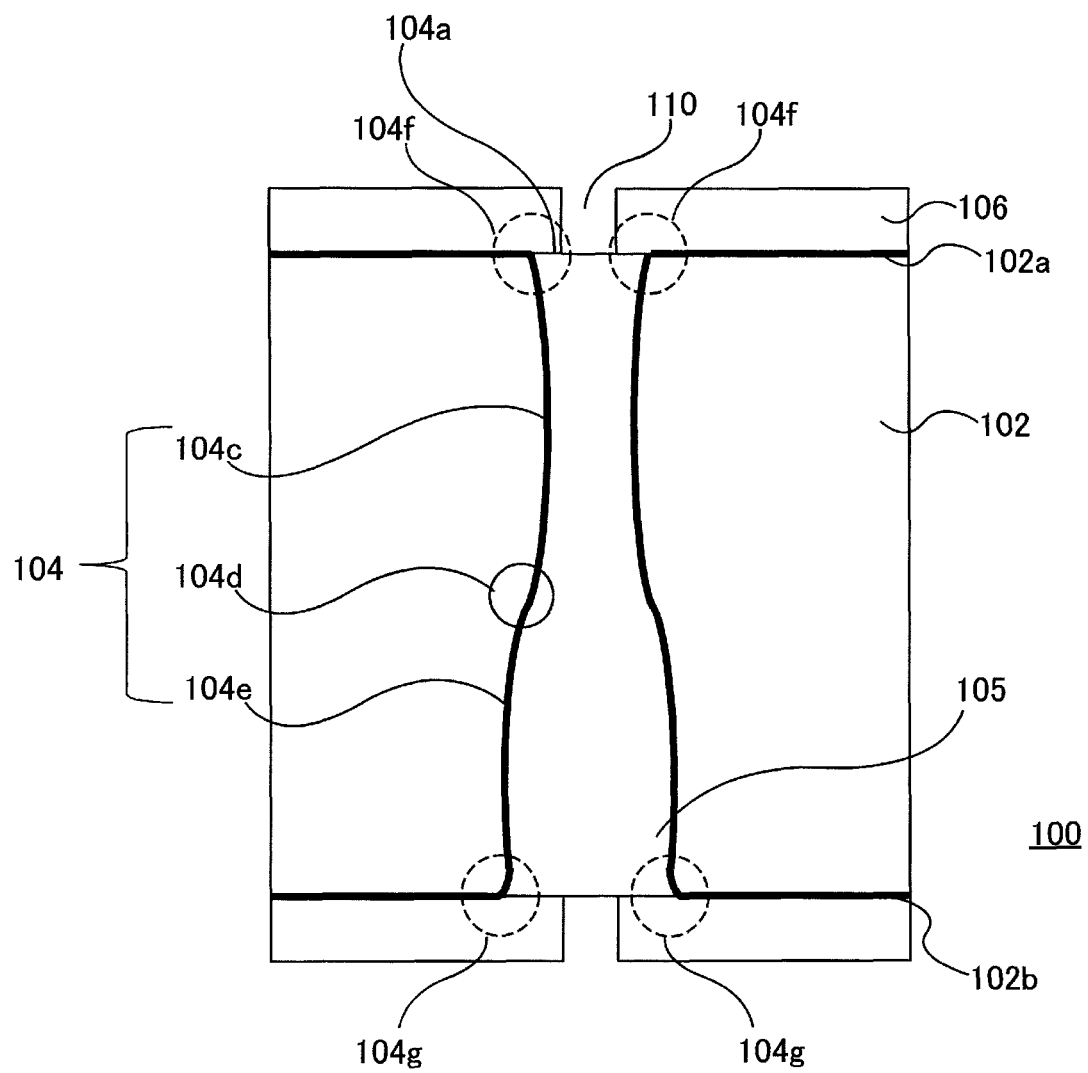
FIG. 5A is a diagram showing a structure of the through-hole electrode substrate 100 of the embodiment of the invention related to a fifth embodiment.
Figure 5B:
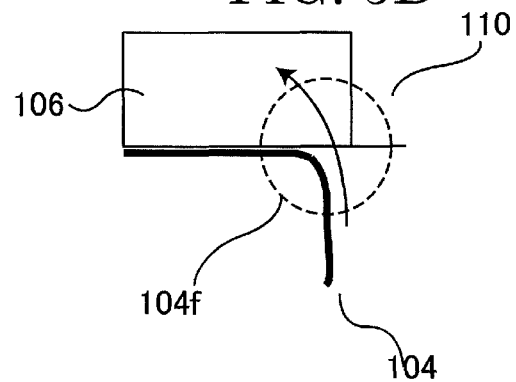
FIG. 5B is a diagram showing a structure of the through-hole electrode substrate 100 of the embodiment of the invention related to a fifth embodiment.

FIG. 5A is a cross-sectional diagram of the through-hole electrode substrate 100 of the embodiment of the invention related to the present embodiment. In addition, FIG. 5B is an expanded view diagram of the part 104f in FIG. 5A. Furthermore, both FIG. 5A and FIG. 5B show a part of the through-hole electrode substrate 100 of the embodiment of the invention related to the present embodiment for the convenience of explanation.

As is shown in FIG. 5A, the through-hole electrode substrate 100 of the embodiment of the invention related to the present embodiment includes a connection part 104f with a first surface of the first aperture 101a of the through-hole 104 and the connection part 104f has a curved surface. In addition, a connection part 104g with a first surface of the first aperture 101a of the through-hole 104 has a curved surface. Since the remaining structure is the same as in the first embodiment, an explanation is omitted.

Since the connection part 104f and connection part 104g of the through-hole 104 in the through-hole electrode substrate 100 of the embodiment of the invention related to the present embodiment include a curved surface, it is possible to easily fill the filler 405.

In addition, by providing a connection part with a first surface of a first aperture of a through-hole with a curved surface and by providing a connection part of a second surface of a second aperture of a through-hole with a curved surface, it is possible to adopt the same structure as the present embodiment in the first to fourth embodiments described above.

Sixth Embodiment

Figure 6:
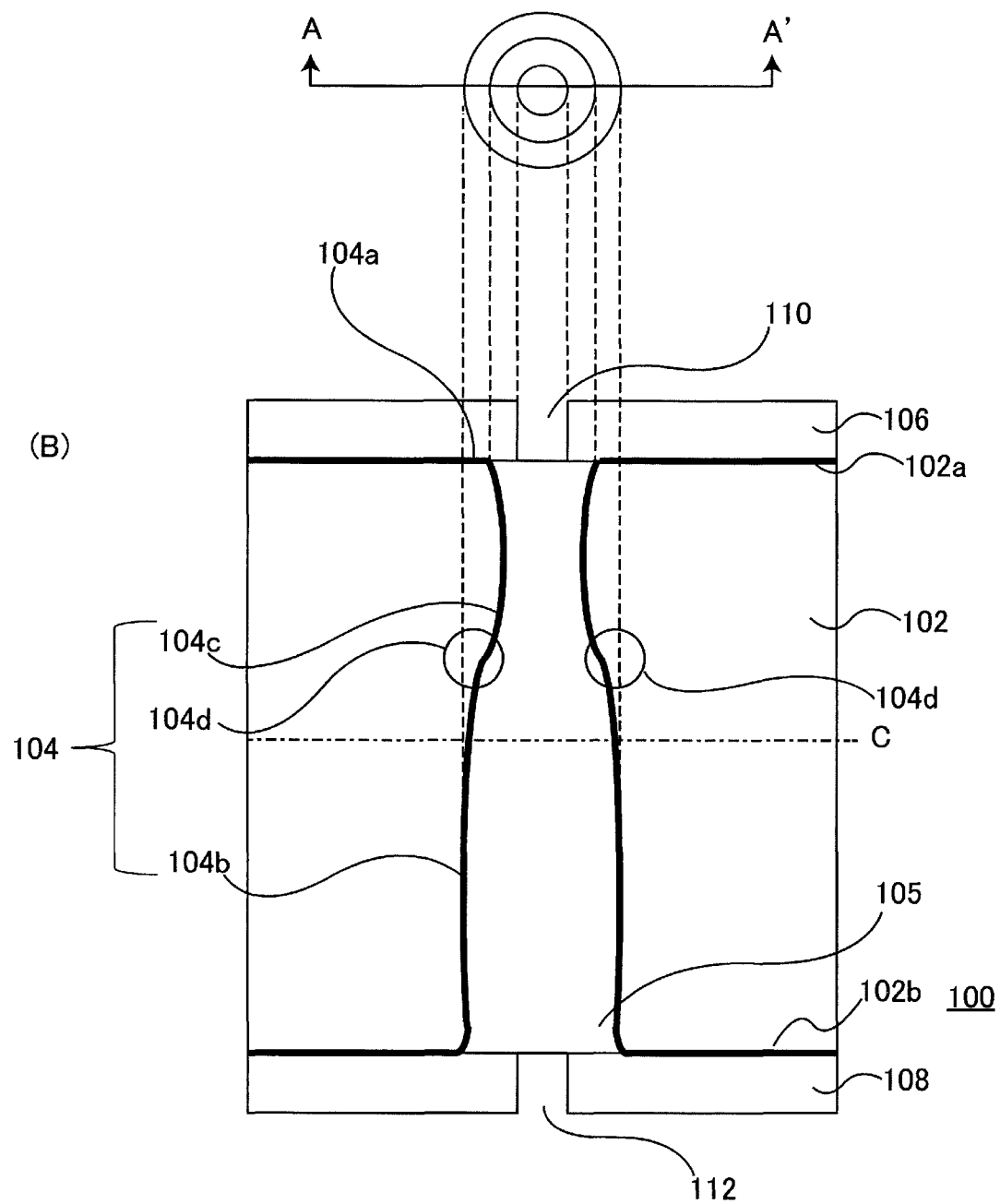
FIG. 6 is a diagram showing a structure of the through-hole electrode substrate 100 of the embodiment of the invention related to a sixth embodiment.

The structure of the through-hole electrode substrate 100 of the embodiment of the invention related to the sixth embodiment is explained while referring to FIG. 6. FIG. 6 (A) is a planar diagram of the through-hole electrode substrate 100 of the embodiment of the invention related to the present embodiment seen from the upper surface. FIG. 6 (B) is a cross-sectional diagram of the line A~A' in FIG. 6 (A). Both FIGS. 6 (A) and (B) show a part of the through-hole electrode substrate 100 of the embodiment of the invention related to the present embodiment for the convenience of explanation.

As is shown in FIG. 5 (A), the through-hole electrode substrate 100 of the embodiment of the invention related to the present embodiment is arranged with the inflection point 104d of the through hole 104 nearer to the first aperture 104a than the center of the through-hole 104. Since the remaining structure is the same as in the first embodiment, an explanation is omitted.

In addition, by arranging an inflection point of a through-hole nearer a first aperture than the center of the through-hole, it is possible to adopt the same structure as the present embodiment in the first to fifth embodiments described above.

Seventh Embodiment

Figure 7:
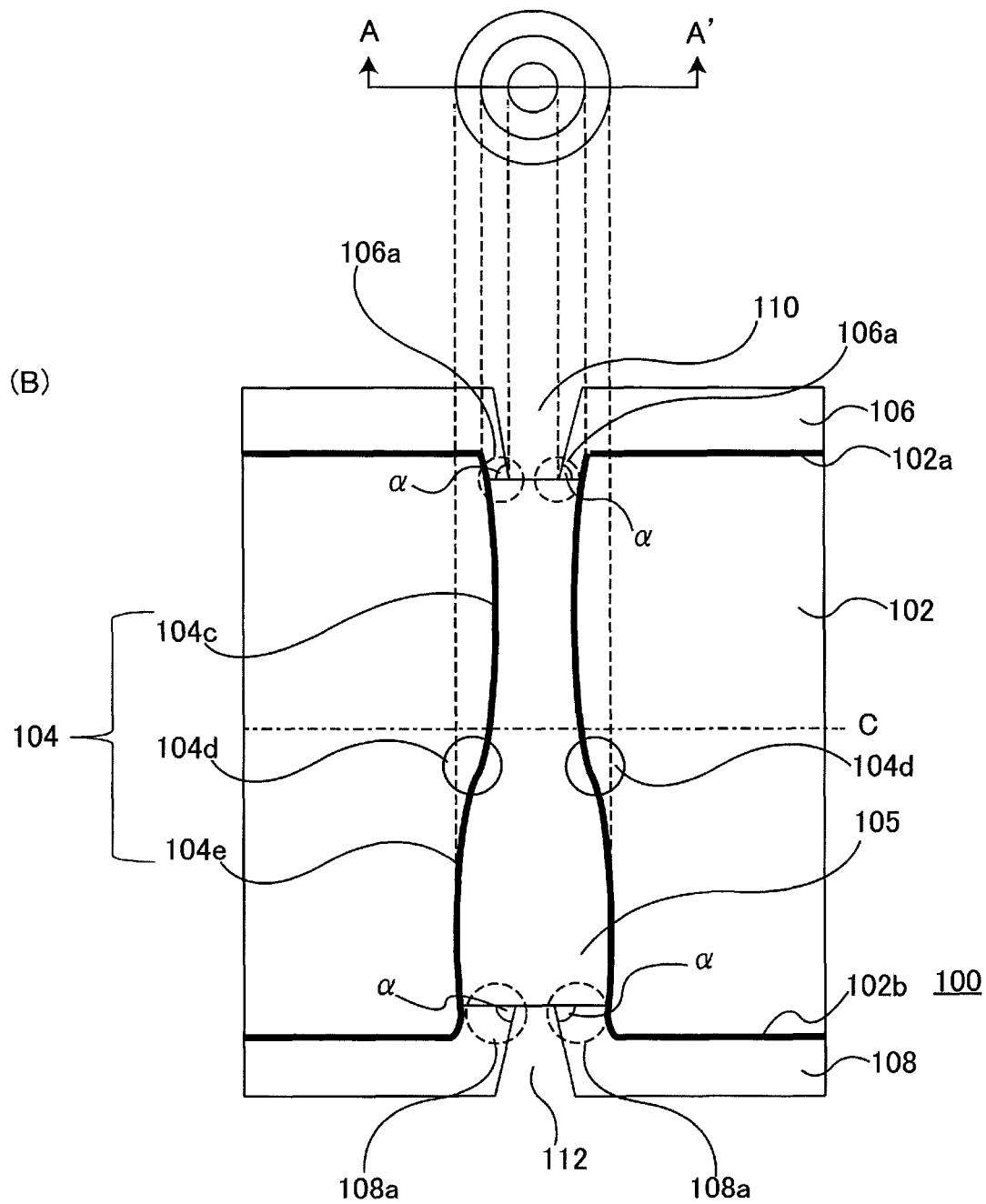
FIG. 7 is a diagram showing a structure of the through-hole electrode substrate 100 of the embodiment of the invention related to a seventh embodiment.

The structure of the through-hole electrode substrate 100 of the embodiment of the invention related to the seventh embodiment is explained while referring to FIG. 7. FIG. 7 (A) is a planar diagram of the through-hole electrode substrate 100 of the embodiment of the invention related to the present embodiment seen from the upper surface. FIG. 7 (B) is a cross-sectional diagram of the line A~A' in FIG. 7 (A). Both FIGS. 7 (A) and (B) show a part of the through-hole electrode substrate 100 of the embodiment of the invention related to the present embodiment for the convenience of explanation.

As is shown in FIG. 7 (A), in the through-hole electrode substrate 100 of the embodiment of the invention related to the present embodiment the apertures (via's) 110 and 112 of the gas discharge member 106 and 108 are arranged so that the area seen from a planar view (that is, see from an upper surface) becomes larger as they separate from the substrate 102 side. In other words, in a cross-sectional view (that is, seen along the cross-section A~A'), an angle α formed between the gas discharge member 106 and 108 and the filler 105 is about 45 degrees~89 degrees. Since the remaining structure is the same as in the first embodiment, an explanation is omitted. Although the insulation layers 106 and 108 are formed by a desired patterning using photolithography using a photosensitive material with insulation properties for example, the apertures (via's) 110 and 112 of the gas discharge members 106 and 108 can be formed so that the area seen from a planar view becomes larger as they separate from the substrate 102 side by adjusting the exposure conditions.

In the through-hole electrode substrate 100 of the embodiment of the invention related to the present embodiment, it is possible to prevent step-cut of wiring arranged in an aperture (via) by providing the structure described above.

Figure 8A:
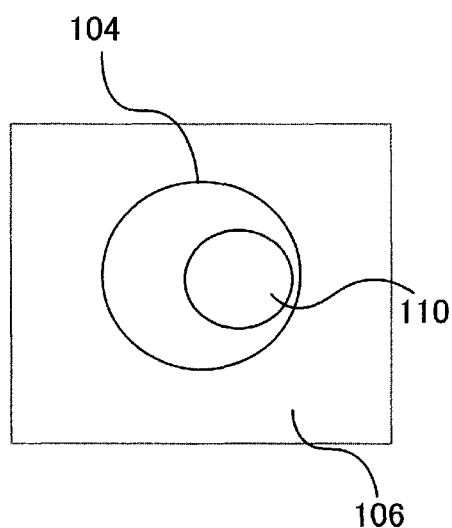
FIG. 8A shows an example in which an aperture (via) 110 of a filler 105 is misaligned in the through-hole electrode substrate 100 of the embodiment of the invention related to the seventh embodiment.
Figure 8B:
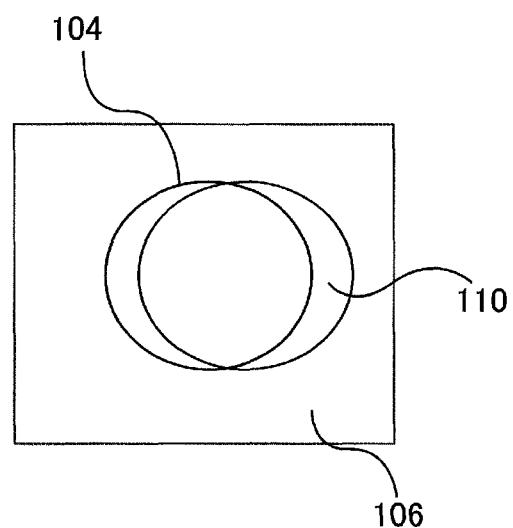
FIG. 8B shows an example in which an aperture (via) 110 of a filler 105 is misaligned in the through-hole electrode substrate 100 of the embodiment of the invention related to the seventh embodiment.

In addition, a roughly planar view of the through-hole electrode substrate 100 of the embodiment of the invention related to the present embodiment is shown in FIG. 8A and FIG. 8B. In the present embodiment, the apertures (via's) 110 and 112 of the gas discharge member 106 and 108 are arranged so that the area seen from a planar view (that is, see from an upper surface) becomes larger as they separate from the substrate 102 side, and since it is possible to reduce the area of the apertures (via's) 110 and 112 above the filler 105 and secure a contact between the apertures (via's) 110 and 112 and the filler 105, it is possible to reduce the possibility of contact defects due to misalignment when forming the apertures (via's) 110 and 112.

For example, FIG. 8A shows the case where the aperture (via) 110 above the filler 105 is misaligned on the right side.

In addition, FIG. 8B shows the case where the aperture (via) 110 above the filler 105 is misaligned on the right side and a part of the aperture (via) 110 becomes separated from above the filler 105. In both cases shown in FIG. 8A and FIG. 8B, since it is possible to secure a contact between the apertures (via') 110 and 112 and the filler 105, it is possible to reduce the possibility of contact defects due to misalignment of the apertures (via's) 110 and 112.

Figure 9:
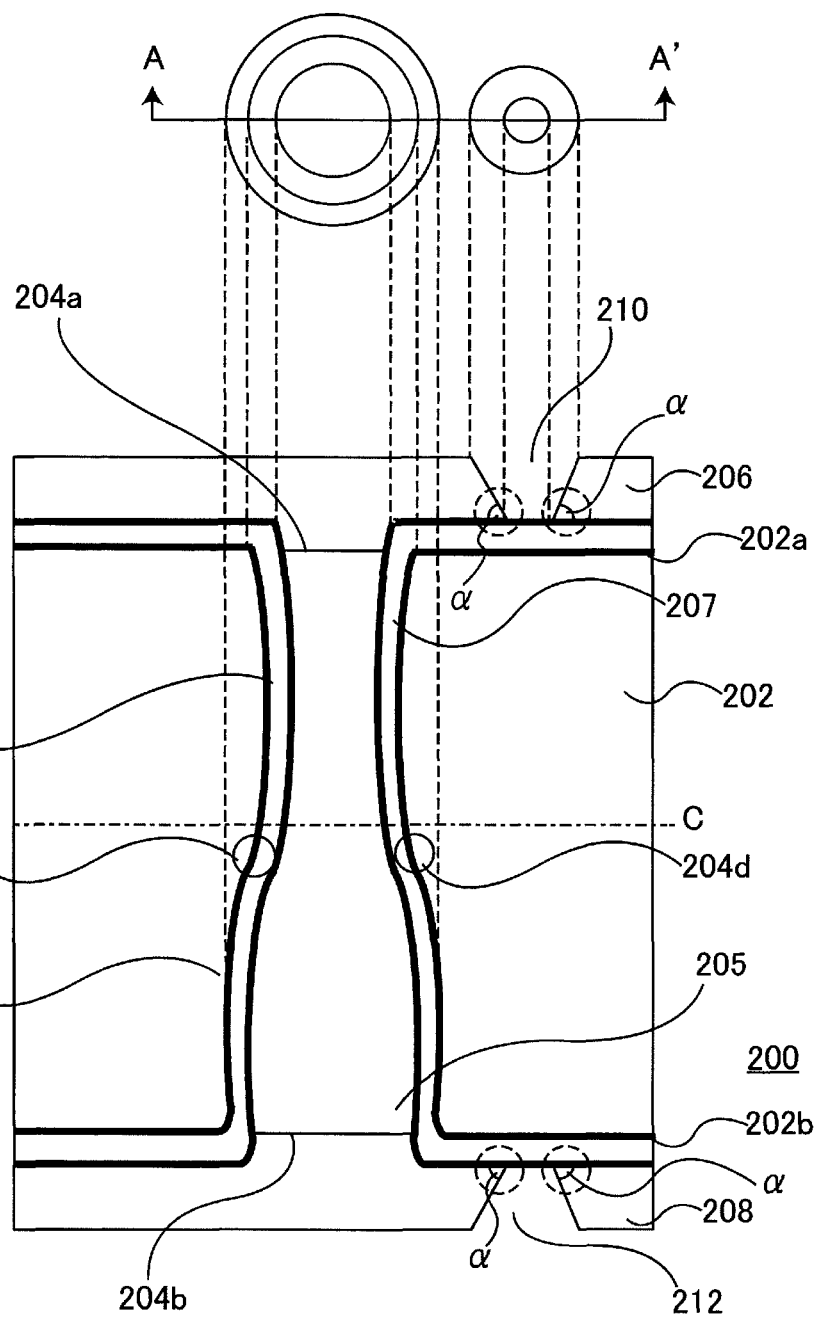
FIG. 9 is a diagram showing a structure of the through-hole electrode substrate 300 of the embodiment of the invention related to the seventh embodiment.
Figure 10:
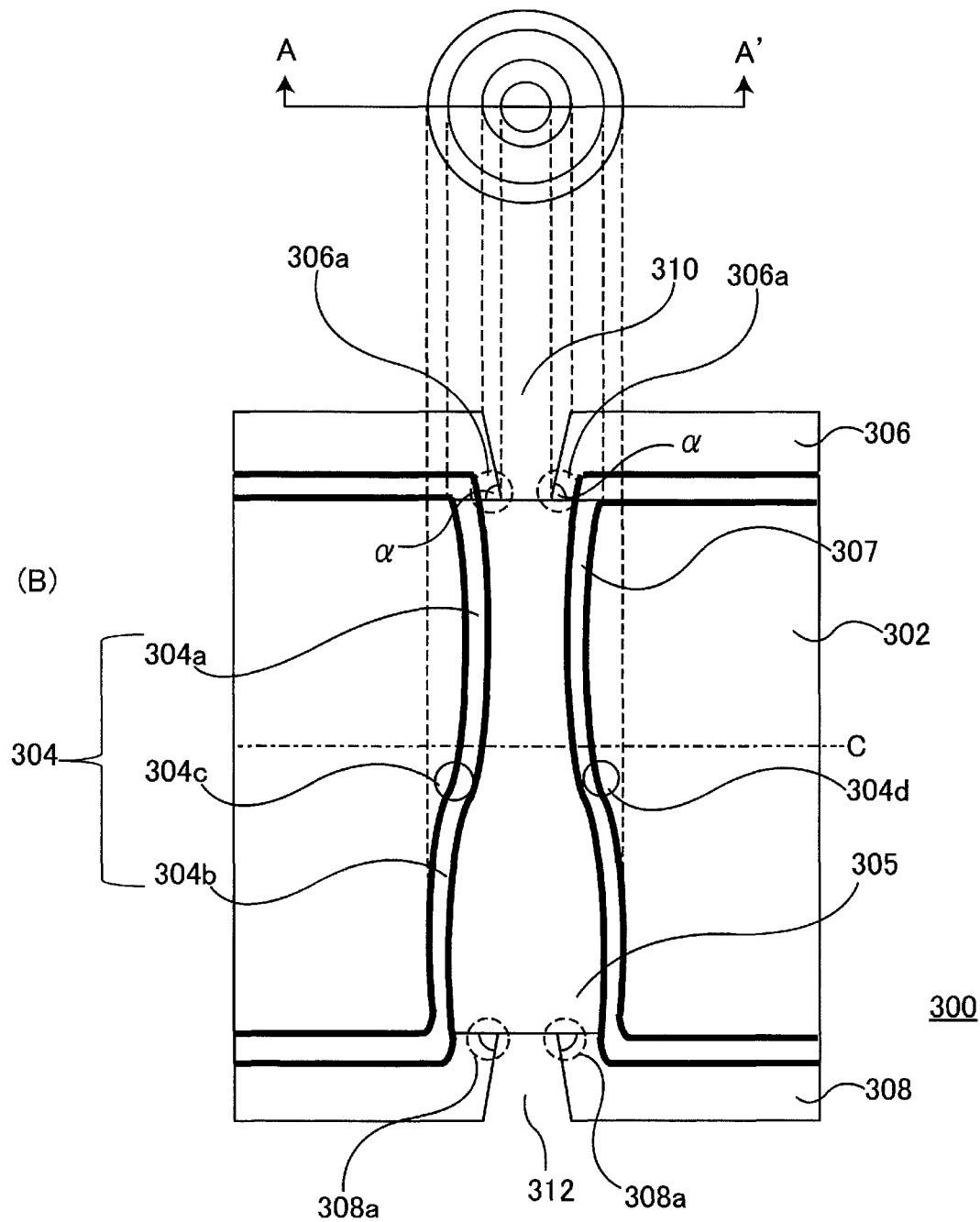
FIG. 10 is a diagram showing a structure of the through-hole electrode substrate 300 of the embodiment of the invention related to the seventh embodiment.
Figure 11:
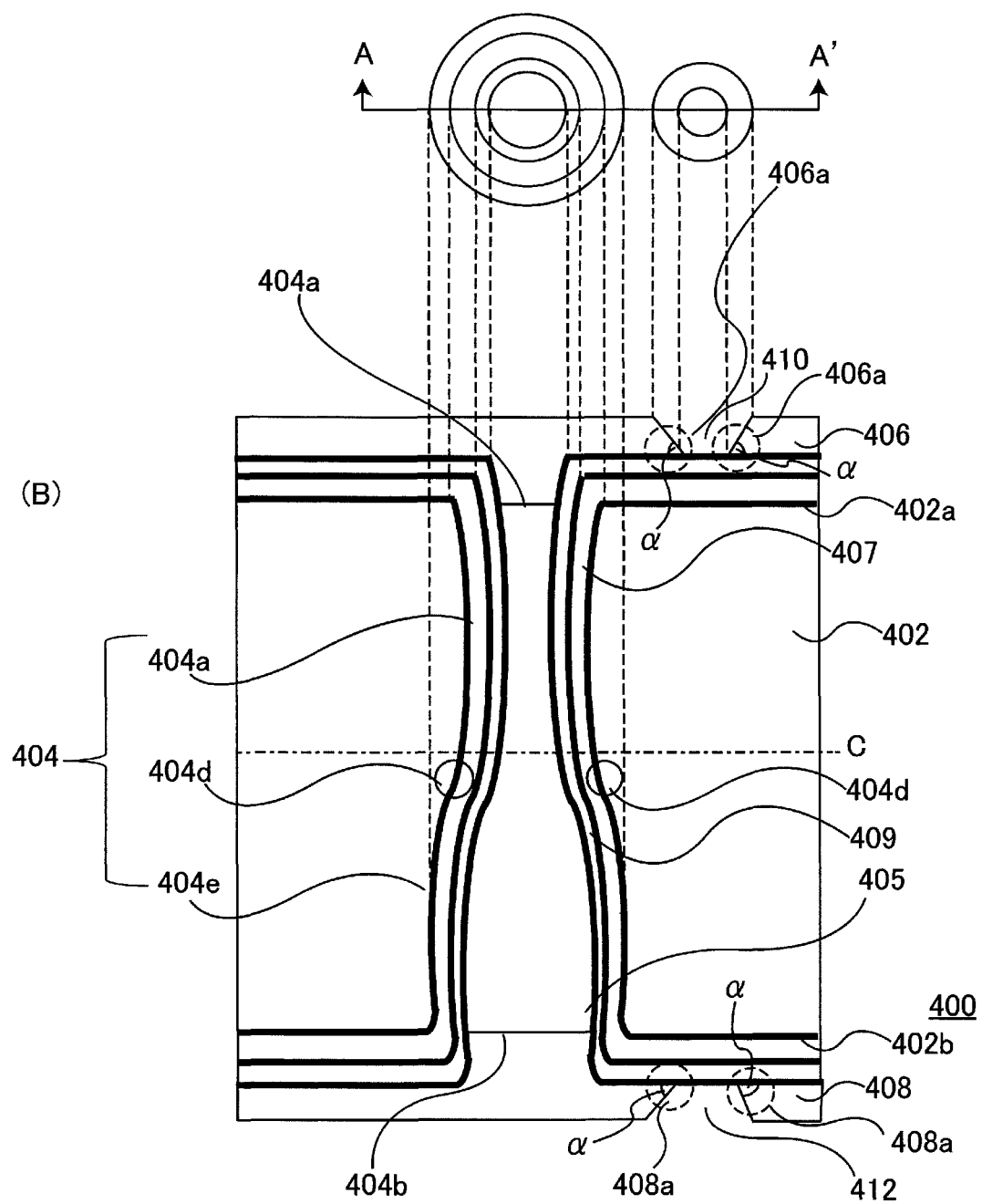
FIG. 11 is a diagram showing a structure of the through-hole electrode substrate 400 of the embodiment of the invention related to the seventh embodiment.

In addition, as is shown in FIG. 9~11, it is possible to adopt the same structure as the present embodiment in the first to fourth embodiments described above as explained below.

As is shown in FIG. 9 (A), in the through-hole electrode substrate 200 of the embodiment of the invention related to the present embodiment, the apertures (via's) 210 and 212 of the gas discharge members 206 and 208 are arranged so that the area seen from a planar view (that is, see from an upper surface) becomes larger as they separate from the substrate 202 side. In other words, in a cross-sectional view (that is, seen along the cross-section A~A'), an angle α formed between the gas discharge members 206 and 208 and the filler 205 is about 45 degrees~89 degrees. Since the remaining structure is the same as in the second embodiment, an explanation is omitted.

As is shown in FIG. 10 (A), in the through-hole electrode substrate 300 of the embodiment of the invention related to the present embodiment, the apertures (via's) 310 and 312 of the gas discharge members 306 and 308 are arranged so that the area seen from a planar view (that is, see from an upper surface) becomes larger as they separate from the substrate 302 side. In other words, in a cross-sectional view (that is, seen along the cross-section A~A'), an angle α formed between the gas discharge members 306 and 308 and the filler 305 is about 45 degrees 89 degrees. Since the remaining structure is the same as in the third embodiment, an explanation is omitted.

As is shown in FIG. 11 (A), in the through-hole electrode substrate 400 of the embodiment of the invention related to the present embodiment, the apertures (via's) 410 and 412 of the gas discharge members 406 and 408 are arranged so that the area seen from a planar view (that is, see from an upper surface) becomes larger as they separate from the substrate 402 side. In other words, in a cross-sectional view (that is, seen along the cross-section A~A'), an angle α formed between the gas discharge members 406 and 408 and the filler 405 is about 45 degrees~89 degrees. Since the remaining structure is the same as in the fourth embodiment, an explanation is omitted.

As explained above, since it is possible to reduce the area of an aperture (via) above a filler and secure a contact between the apertures (via) and the filler, it is also possible to reduce the possibility of contact defects due to misalignment when forming the aperture (via) in any of the structures of the present embodiment.

Eighth Embodiment

Figure 12:
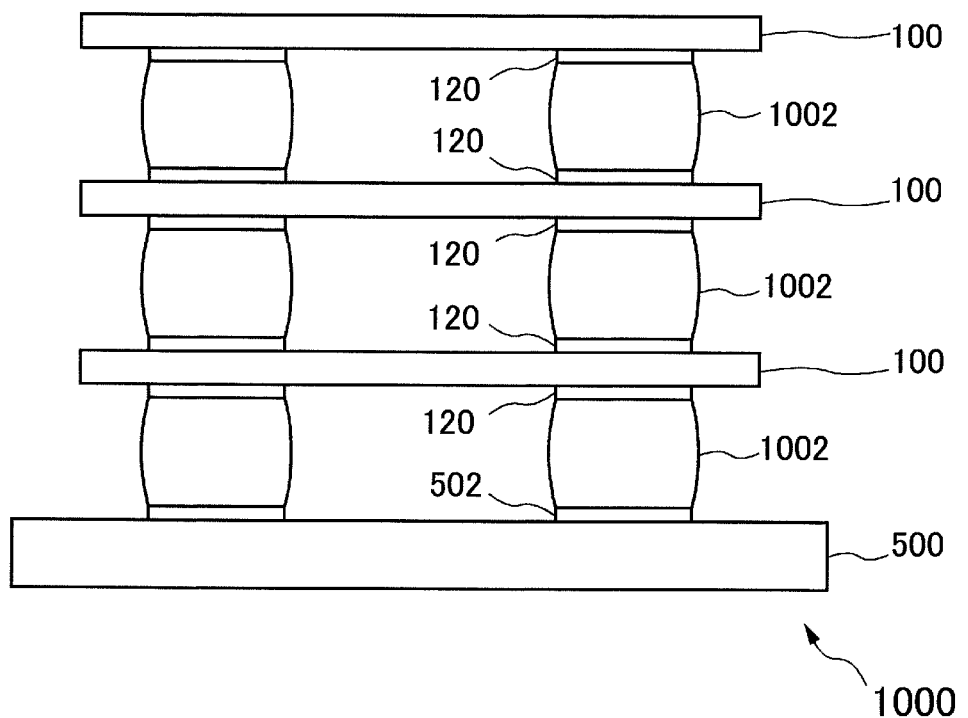
FIG. 12 is a diagram showing a structure of a through-hole electrode substrate 1000 of the embodiment of the invention related to an eighth embodiment.
Figure 13:
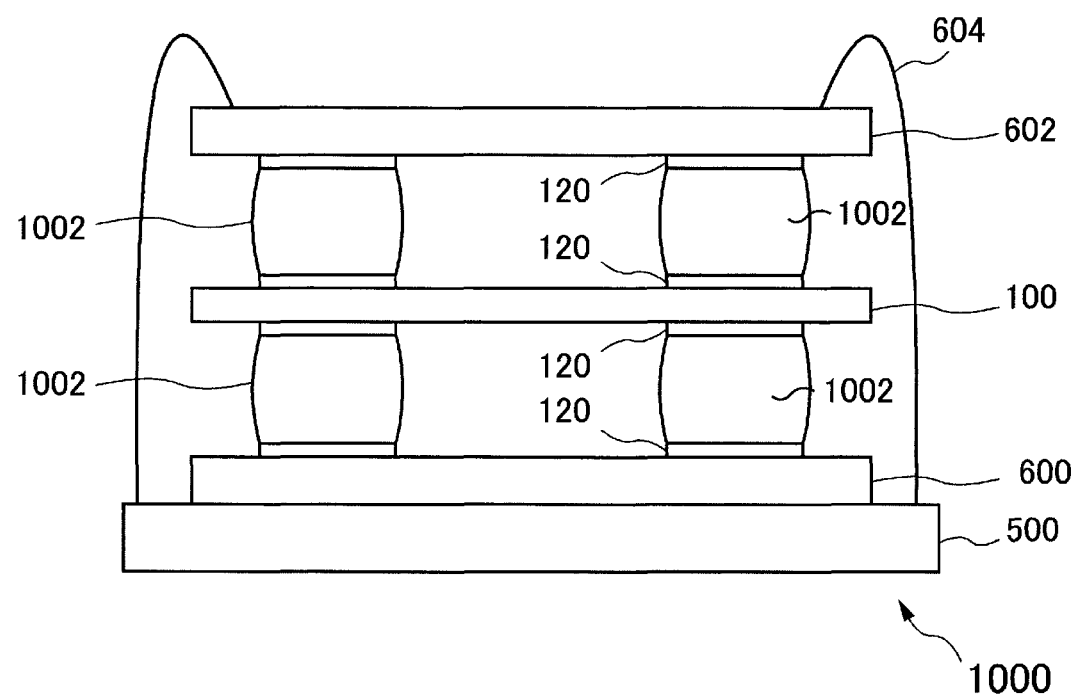
FIG. 13 is a diagram showing a structure of the through-hole electrode substrate 1000 of the embodiment of the invention related to the eighth embodiment.
Figure 14:
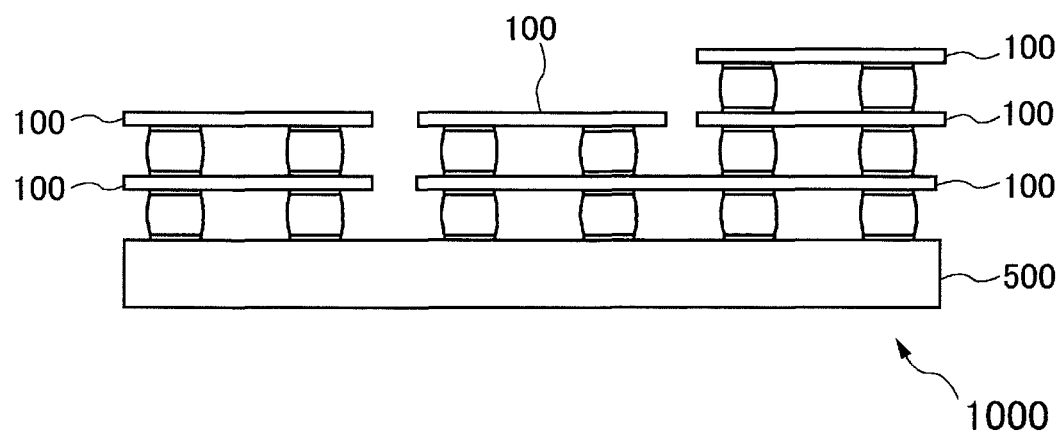
FIG. 14 is a diagram showing a structure of the through-hole electrode substrate 1000 of the embodiment of the invention related to the eighth embodiment.

The structure of a semiconductor device 1000 of the embodiment of the invention related to the eighth embodiment is explained while referring to FIG. 12~14. In the present embodiment, a semiconductor device 1000 using the through-hole electrode substrates in the first to seventh embodiments described above is explained.

FIG. 12 shows a semiconductor device 1000 related to the present embodiment. The semiconductor device 1000 is stacked with three through-hole electrode substrates 100 related to the embodiment of the invention and is connected to a LSI substrate (semiconductor substrate) 500. The LSI substrate 500 is arranged with a wiring layer 502. Semiconductor elements such as a DRAM for example are arranged above the through-hole electrode substrate 100. A wiring layer 120 is arranged in the through-hole electrode substrate 100. As is shown in FIG. 12, the wiring layer 502 of the LSI substrate 500 and the wiring layer 120 of the through-hole electrode substrate 100 are connected via a bump 1002. A metal such as indium, copper or gold for example is used for the bump 1002. In addition, as is shown in FIG. 12, the wiring layer 120 of the through-hole electrode substrate 100 is connected with the wiring layer 120 of a different through-hole electrode substrate 100 via the bump 1002.

Furthermore, the embodiment of the invention is not limited to three layers in the case where the through-hole electrode substrates 100 are stacked, two layers or four layers are also possible. In addition, the embodiment of the invention is not limited to using a bump in the connection between the through-hole electrode substrate 100 and another substrate, eutectic bonding or another bonding technology may also be used. In addition, the through-hole electrode substrate 100 and another substrate may be adhered together by coating polyimide or an epoxy resin and sintering.

FIG. 13 shows another example of the semiconductor device 1000 of the embodiment of the invention related to present embodiment. The semiconductor device 1000 shown in FIG. 13 is stacked with a semiconductor chip (LSI chip) 600 and 602 such as a MEMS device, CPU, memory or IC, and the through-hole electrode substrate 100, and is connected to a LSI substrate 500

The through-hole electrode substrate 100 is arranged between the semiconductor chip 600 and the semiconductor chip 602 and both are connected via a bump 1002. The semiconductor chip 600 is mounted above the LSI substrate 500 and the LSI substrate 500 and the semiconductor chip 602 are connected via a wire 604. In the present example, the through-hole electrode substrate 100 is used as an interposer for three-dimensional mounting by stacking a plurality of semiconductor chips, and by stacking a plurality of semiconductor chips each with a different function it is possible to form a multi-functional semiconductor device. For example, by forming the semiconductor chip 600 into a tri-axial acceleration sensor and the semiconductor chip 602 into a bi-axial magnetic sensor, it is possible to realize a semiconductor device in which a five-axis motion sensor is realized using one module.

In the case where a semiconductor chip is a sensor formed using a MEMS device, the sensing results are sometimes output using an analog signal. In this case, a low pass filter or amplifier and the like may be formed in the semiconductor chip 600, 602 or through-hole electrode substrate 100.

FIG. 14 shows another example of the semiconductor device 1000 related to the present embodiment. Although the two examples (FIG. 12, FIG. 13) described above were three-dimensional mounting, the present example applies the through-hole electrode substrate 100 to a two dimensional and three dimensional combined mounting. In the example shown in FIG. 14, six through-hole electrode substrates 100 are stacked and connected to the LSI substrate 500. However, not only are all the through-hole electrode substrates 100 stacked but are also arranged aligned in a substrate in-plane direction.

In the example in FIG. 14, two through-hole electrode substrates 100 are connected above the LSI substrate 500, a further through-hole electrode substrate 100 is arranged above the two through-hole electrode substrates 100, and a further through-hole electrode substrate 100 is arranged above. Furthermore, as in the example shown in FIG. 13, two dimensional and three dimensional combined mounting is possible even when the through-hole electrode substrate 100 is used as an interposer or connecting a plurality of semiconductor chips. For example, several through-hole electrode substrates 100 may be replaced for a semiconductor chip.

In addition, although an example in which the through-hole electrode substrate 100 of the embodiment of the invention related to the first embodiment is used as a through-hole electrode substrate in the examples in FIG. 12~14, the embodiment of the invention is not limited to this and the through-hole electrode substrates 200, 300 and/or 400 of the embodiment of the invention related to the other embodiments may also be used.

The semiconductor device 1000 of the embodiment of the invention related to the present embodiment is mounted in various electronic devices for example in a mobile terminal (mobile phone, smartphone and note type personal computer and the like), a data processing device (desktop type personal computer, server, car navigation and the like) and household appliances and the like.

According to the embodiment of the invention, it is possible to provide a through-hole electrode substrate and a semiconductor device with a high level of reliability which can eliminate defects due to gas collecting in a gas reservoir in a through-hole and allows prevention of dropout of a filler from within the through-hole.

What is claimed is:

1. A through-hole electrode substrate comprising:
a substrate including a through-hole extending from a first aperture of a first surface to a second aperture of a second surface and having a side wall between the first aperture and the second aperture; and
at least one of a filler, a conductive film and an insulation layer arranged on the side wall of the through-hole, wherein
at least a part of the side wall of the through-hole in a cross-sectional view includes a curve having an inflection point,
the inflection point is located at a side of the first surface than a middle of the first surface and the second surface,
the side wall has a slope inclining with respect to a direction orthogonal to the first surface, and
the slope faces to the second surface.

2. A through-hole electrode substrate comprising:
a substrate including a through-hole extending from a first aperture of a first surface to a second aperture of a second surface and having a side wall between the first aperture and the second aperture; and
at least one of a filler, a conductive film and an insulation layer arranged on the side wall of the through-hole, wherein
an area of the second aperture is larger than an area of the first aperture,
the through-hole has a minimum aperture part between the first aperture and the second aperture, and
an area of the minimum aperture part in a planar view is smallest among a plurality of areas of the through-hole in a planar view.

* * * * *